US012672338B2

(12) United States Patent
Yoon

(10) Patent No.: US 12,672,338 B2
(45) Date of Patent: Jun. 30, 2026

(54) SEMICONDUCTOR DEVICE HAVING NMOS TRANSISTORS AND CHANNELS OF PMOS TRANSISTORS FORMED OF SILICON/SILICON GERMANIUM/SILICON WHEREIN SILICON GERMANIUM NOT IN CONTACT WITH SILICON OXIDE

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 434 days.

(21) Appl. No.: 18/323,416

(22) Filed: May 25, 2023

(65) Prior Publication Data

US 2024/0153825 A1     May 9, 2024

(30) Foreign Application Priority Data

Nov. 8, 2022     (KR) ........................ 10-2022-0147764

(51) Int. Cl.
| | |
|---|---|
| *H10D 84/85* | (2025.01) |
| *B82Y 10/00* | (2011.01) |
| *H10D 84/01* | (2025.01) |
| *H10D 84/03* | (2025.01) |

(Continued)

(52) U.S. Cl.
CPC ....... *H10D 84/038* (2025.01); *H10D 84/0167* (2025.01); *H10D 84/017* (2025.01); *H10D 84/0181* (2025.01); *H10D 84/856* (2025.01)

(58) Field of Classification Search
CPC ...... B82Y 10/00; B82Y 40/00; H10D 30/014; H10D 30/43; H10D 30/6735; H10D 30/6757; H10D 62/121; H10D 64/017; H10D 84/0167; H10D 84/017; H10D 84/0172; H10D 84/0177; H10D 84/0179;

(Continued)

(56) References Cited

U.S. PATENT DOCUMENTS

| | | | | | |
|---|---|---|---|---|---|
| 9,224,810 | B2 * | 12/2015 | Kim et al. | .......... | H01L 29/0673 |
| 11,404,325 | B2 * | 8/2022 | Ng et al. | ......... | H01L 21/823821 |
| 2014/0197377 | A1 | 7/2014 | Kim et al. | | |

(Continued)

FOREIGN PATENT DOCUMENTS

| | | |
|---|---|---|
| KR | 10-2015-0051445 A | 5/2015 |
| KR | 10-2020-0084532 A | 7/2020 |
| KR | 10-2023-0008443 A | 1/2023 |

OTHER PUBLICATIONS

Office Action for Korean Patent Application No. 10-2022-0147764 issued by the Korean Patent Office on Feb. 24, 2026.

*Primary Examiner* — Wael M Fahmy
*Assistant Examiner* — Alice W Tang
(74) *Attorney, Agent, or Firm* — IP & T GROUP LLP

(57) ABSTRACT

A semiconductor device includes an NMOS transistor structure formed over an NMOS area of a substrate; and a PMOS transistor structure formed over a PMOS area of the substrate. The NMOS transistor structure includes NMOS source/drain regions, and NMOS channel patterns and NMOS gate structures alternately and repeatedly stacked between the NMOS source/drain regions. The PMOS transistor structure includes PMOS source/drain regions, and PMOS channel patterns and PMOS gate structures alternately and repeatedly stacked between the PMOS source/drain regions.

14 Claims, 37 Drawing Sheets

(51) Int. Cl.
*B82Y 40/00*          (2011.01)
*H10D 30/43*         (2025.01)

(58) Field of Classification Search
CPC .. H10D 84/0181; H10D 84/038; H10D 84/85;
H10D 84/856
See application file for complete search history.

(56)                       References Cited

U.S. PATENT DOCUMENTS

| | | | |
|---|---|---|---|
| 2020/0058653 A1* | 2/2020 | Chiang et al. | ...... H01L 27/0924 |
| 2020/0294865 A1 | 9/2020 | Cheng et al. | |
| 2022/0013521 A1* | 1/2022 | Zhang et al. | ....... H01L 27/0922 |

* cited by examiner

SEMICONDUCTOR DEVICE HAVING NMOS TRANSISTORS AND CHANNELS OF PMOS TRANSISTORS FORMED OF SILICON/SILICON GERMANIUM/SILICON WHEREIN SILICON GERMANIUM NOT IN CONTACT WITH SILICON OXIDE

CROSS-REFERENCE TO RELATED APPLICATIONS

The present application claims priority of Korean Patent Application No. 10-2022-0147764, filed on Nov. 8, 2022, which is incorporated herein by reference in its entirety.

BACKGROUND

1. Field

The present disclosure relates generally to a semiconductor device and, more particularly, to a semiconductor device including an NMOS transistor and a PMOS transistor and a method of manufacturing the semiconductor device.

2. Related Art

Recently, semiconductor devices having an NMOS transistor and a PMOS transistor having a plurality of nanosheets and methods of manufacturing the semiconductor devices have been proposed.

SUMMARY

Embodiments of the present disclosure provide semiconductor devices having an NMOS transistor and a PMOS transistor having a plurality of nanosheets.

Embodiments of the present disclosure provide methods of manufacturing the semiconductor devices having an NMOS transistor and a PMOS transistor having a plurality of nanosheets.

A semiconductor device in accordance with an embodiment of the present disclosure incudes an NMOS transistor structure formed over an NMOS area of a substrate; and a PMOS transistor structure formed over a PMOS area of the substrate. The NMOS transistor structure includes NMOS source/drain regions formed over the substrate; and NMOS channel patterns and NMOS gate structures alternately and repeatedly stacked over the substrate between the NMOS source/drain regions in a horizontal direction. The PMOS transistor structure includes PMOS source/drain regions formed over the substrate; and PMOS channel patterns and PMOS gate structures alternately and repeatedly stacked over the substrate between the PMOS source/drain regions in the horizontal direction. Each of the NMOS channel patterns includes a single silicon layer. Each of the PMOS channel patterns includes silicon layers and a silicon germanium layer.

A semiconductor device in accordance with an embodiment of the present disclosure includes an NMOS transistor structure formed over an NMOS area of a substrate; and a PMOS transistor structure formed over a PMOS area of the substrate. The NMOS transistor structure includes NMOS source/drain regions formed over the substrate; and NMOS channel patterns and NMOS gate structures alternately and repeatedly stacked between the NMOS source/drain regions in a horizontal direction. The PMOS transistor structure includes PMOS source/drain regions formed over the substrate; and PMOS channel patterns and PMOS gate structures alternately and repeatedly stacked between the PMOS source/drain regions in the horizontal direction. A vertical thickness of each of the NMOS channel patterns is smaller than a vertical thickness of each of the PMOS channel patterns. A vertical thickness of each of the NMOS gate structures is greater than a vertical thickness of each of the PMOS gate structures.

A semiconductor device accordance with an embodiment of the present disclosure includes an NMOS transistor structure formed over a first area of a substrate; and a PMOS transistor structure formed over a second area of the substrate adjacent to the first area in a horizontal direction. The NMOS transistor structure includes: NMOS source/drain regions formed over the substrate; and NMOS channel patterns and NMOS gate structures alternately and repeatedly stacked over the substrate between the NMOS source/drain regions. The PMOS transistor structure includes: PMOS source/drain regions formed over the substrate; and PMOS channel patterns and PMOS gate structures alternately and repeatedly stacked over the substrate between the PMOS source/drain regions. A vertical thickness of each of the NMOS channel patterns is smaller than a vertical thickness of each of the PMOS channel patterns.

A method of manufacturing a semiconductor device in accordance with an embodiment of the present disclosure includes forming preliminary channel patterns over a substrate having an NMOS area and a PMOS area, wherein each of the preliminary channel patterns includes a sacrificial layer, a first silicon layer, a silicon germanium layer, and a second silicon layer; forming first spaces by removing the sacrificial layers of the preliminary channel patterns in the PMOS area; forming PMOS gate structures in the first spaces; forming second spaces by removing the sacrificial layers and the silicon germanium layers of the preliminary channel patterns in the NMOS area; forming first silicon oxide layers and second silicon oxide layers by oxidizing surfaces of the first silicon layers and the second silicon layers; expanding the second spaces to third spaces by removing the first silicon oxide layers and the second silicon oxide layers; and forming NMOS gate structures in the third spaces.

A method of manufacturing a semiconductor device in accordance with an embodiment of the present disclosure includes forming preliminary channel patterns including sacrificial layers, first silicon layers, silicon germanium layers, and second silicon layers over a substrate having an NMOS area and a PMOS area; forming first spaces by removing the sacrificial layers and the silicon germanium layers of the preliminary channel patterns in the NMOS area; forming first silicon oxide layers and second silicon oxide layers by oxidizing surfaces of the first silicon layers and the second silicon layers exposed in the first spaces; expanding the first spaces to second spaces by removing the first silicon oxide layers and the second silicon oxide layers; forming NMOS gate structures in the second spaces; forming third spaces by removing the sacrificial layers of the preliminary channel patterns in the PMOS area; and forming PMOS gate structures in the third spaces.

A method of manufacturing a semiconductor device in accordance with an embodiment of the present disclosure includes forming preliminary channel patterns including sacrificial layers, first silicon layers, silicon germanium layers, and second silicon layers over a substrate having an NMOS area and a PMOS area; forming first spaces by removing the sacrificial layers in the PMOS area, wherein bottom surfaces of the first silicon layers, top surfaces of the second silicon layers, and a first portion of a surface of the substrate are exposed in the first spaces in the PMOS area; forming second spaces by removing the sacrificial layers and the silicon germanium layers in the NMOS area, wherein bottom and top surfaces of the first silicon layers, bottom and top surfaces of the second silicon layers, and a second portion of the surface of the substrate are exposed in the second spaces in the NMOS area; forming first silicon oxide layer, second silicon oxide layers, and a substrate oxide layer by oxidizing the bottom and top surfaces of the first silicon layer, the bottom and top surfaces of the second silicon layer, and the second portion of the surface of the substrate exposed in the second spaces in the NMOS area; expanding the second spaces into third spaces by removing the first silicon oxide layers, the second silicon oxide layers, and the substrate oxide layer; and forming gate structures in the first spaces and the third spaces.

BRIEF DESCRIPTION OF THE DRAWINGS

FIG. 2 is a longitudinal cross-sectional view taken along lines I-I' and II-II' of FIG. 1 to illustrate the transistor structures of a semiconductor device according to an embodiment of the present disclosure.

FIGS. 3 to 16 are longitudinal cross-sectional views taken along lines I-I' and II-II' of FIG. 1 to describe a method of manufacturing a semiconductor device according to an embodiment of the present disclosure.

FIGS. 17 to 27 are longitudinal cross-sectional views taken along the lines I-I' and II-II' of FIG. 1 to describe a method of manufacturing a semiconductor device according to an embodiment of the disclosure.

FIGS. 28 to 33 are longitudinal cross-sectional views taken along the lines I-I' and II-II' of FIG. 1 to describe a method of manufacturing a semiconductor device according to an embodiment of the present disclosure.

Figure 34:
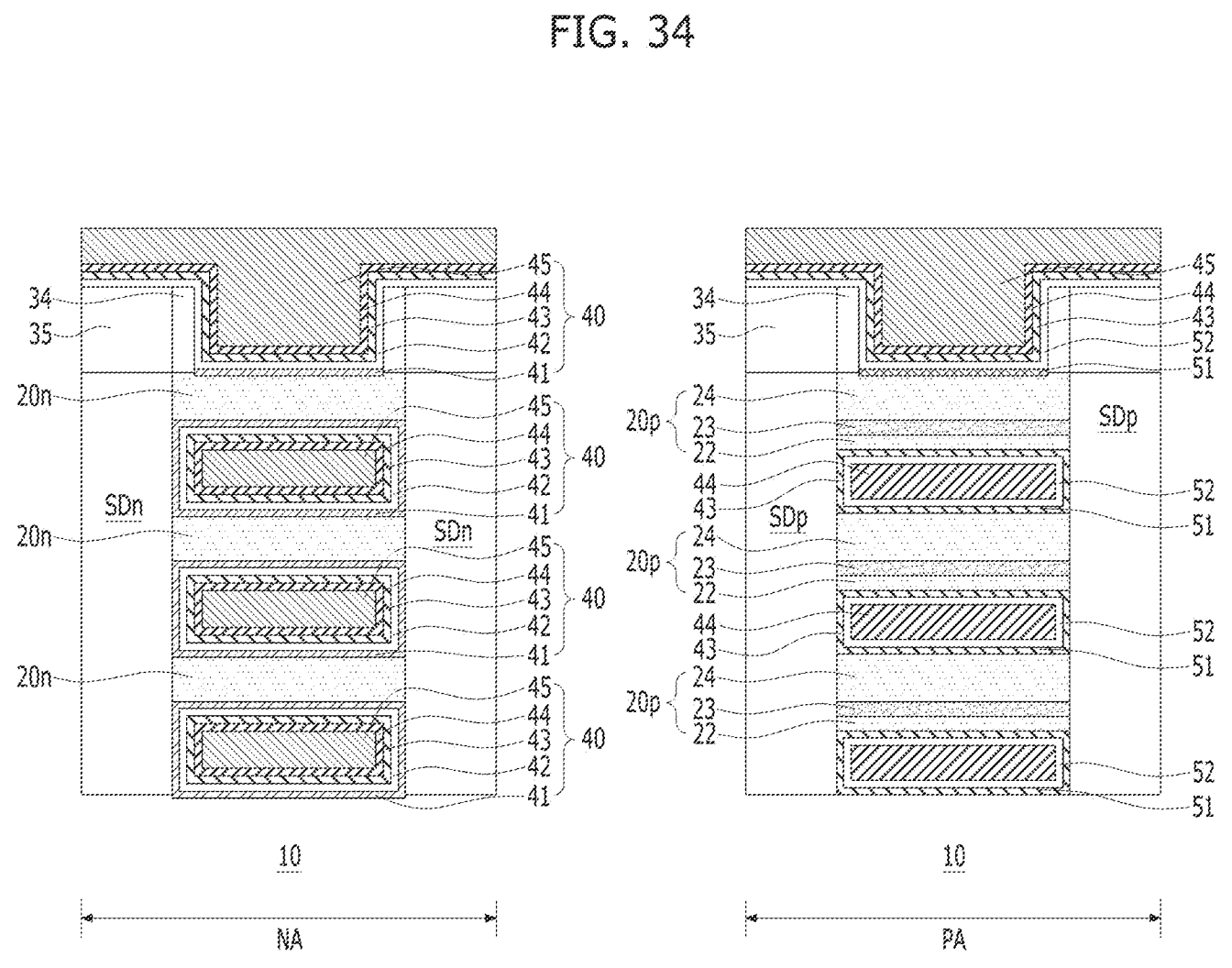

FIGS. 34 to 37 are longitudinal cross-sectional views taken along the lines I-I' and II-II' of FIG. 1 to describe a method of manufacturing a semiconductor device according to an embodiment of the present disclosure.

DETAILED DESCRIPTION

Figure 1:
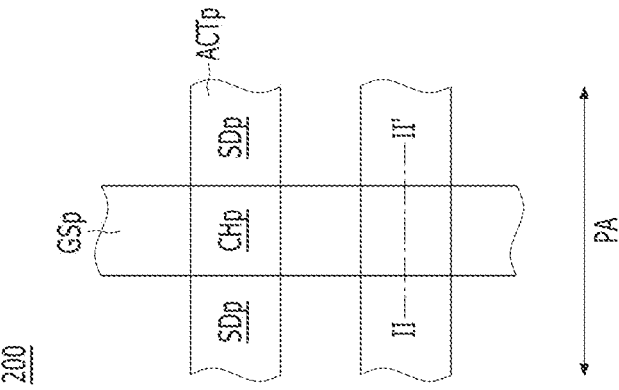
FIG. 1 is a layout illustrating transistor structures of a semiconductor device according to an embodiment of the present disclosure.
Figure 1:
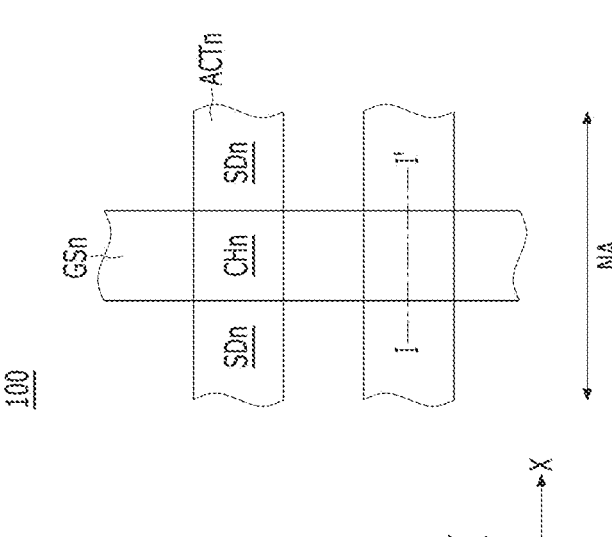

Various embodiments of the present disclosure will be described below in more detail with reference to the accompanying drawings. The present disclosure may, however, be embodied in different forms and should not be construed as limited to the embodiments set forth herein. Rather, these embodiments are provided so that the present disclosure can convey the scope of the present disclosure to those skilled in the art. Throughout the present disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a layout illustrating transistor structures 100 and 200 of a semiconductor device according to an embodiment of the present disclosure. Referring to FIG. 1, a semiconductor device according to an embodiment of the present disclosure may include an NMOS transistor structure 100 disposed in an NMOS area NA and a PMOS transistor structure 200 disposed in a PMOS area PA. The NMOS transistor structure 100 may include an NMOS active region ACTn extending in a first horizontal direction X and an NMOS gate structure GSn extending in a second horizontal direction Y. The NMOS active region ACTn may include an NMOS channel CHn overlapping the NMOS gate structure GSn and NMOS source/drain regions SDn not overlapping the NMOS gate structure GSn. The PMOS transistor structure 200 may include a PMOS active region ACTp extending in the first horizontal direction X and a PMOS gate structure GSp extending in the second horizontal direction Y. The PMOS active region ACTp may include a PMOS channel structure CHp overlapping the PMOS gate structure GSp and PMOS source/drain regions SDp not overlapping the PMOS gate structure GSp. The first horizontal direction X and the second horizontal direction Y may be perpendicular to each other.

Figure 2:
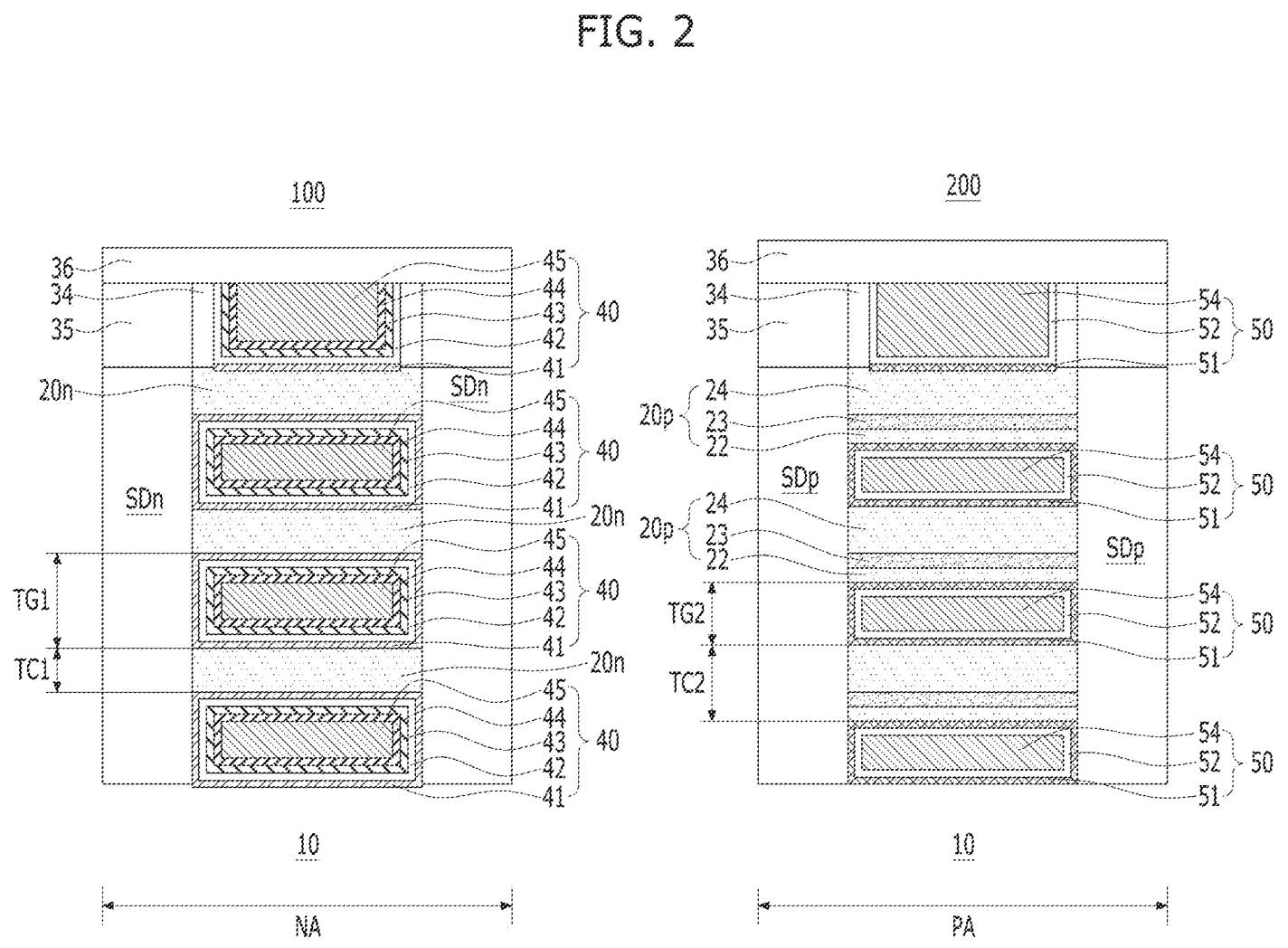

FIG. 2 is a longitudinal cross-sectional view taken along lines I-I' and II-II' of FIG. 1 to illustrate the transistor structures 100 and 200 of a semiconductor device according to an embodiment of the present disclosure. Referring to FIG. 2, a semiconductor device according to an embodiment of the present disclosure may include an NMOS transistor structure 100 disposed in an NMOS area NA of a substrate 10 and a PMOS transistor structure 200 disposed in a PMOS area PA of the substrate 10.

The NMOS transistor structure 100 may include NMOS source/drain regions SDn, a plurality of NMOS channel patterns 20n, and a plurality of NMOS gate structures 40 formed on the substrate 10 of the NMOS area NA. The NMOS source/drain regions SDn may include an N-type semiconductor layer. For example, the NMOS source/drain regions SDn may include silicon (Si) layer containing phosphorus (P) (i.e., Si:P). The plurality of NMOS channel patterns 20n and the plurality of NMOS gate structures 40 may be alternately and repeatedly stacked in a vertical direction. Each of the plurality of NMOS channel patterns 20n may include a semiconductor pattern such as a silicon pattern. In an embodiment, the silicon pattern may comprise a single layer of silicon. Each of the plurality of NMOS gate structures 40 may include an NMOS interfacial insulating layer 41, an NMOS gate insulating layer 42, an NMOS gate barrier layer 43, an NMOS outer gate electrode 44, and an NMOS inner gate electrode 45. The NMOS outer gate electrode 44 may surround top, bottom, and side surfaces of the NMOS inner gate electrode 45. The NMOS gate barrier layer 43 may surround top, bottom, and side surfaces of the NMOS outer gate electrode 44. The NMOS gate insulating layer 42 may surround top, bottom, and side surfaces of the NMOS gate barrier layer 43. The NMOS interfacial insulating layer 41 may surround the top, bottom, and side surfaces of the NMOS gate insulating layer 42. The NMOS outer gate electrode 44 of the NMOS gate structure 40 positioned at the uppermost level may surround bottom and side surfaces of the NMOS inner gate electrode 45 in a U-shape. The NMOS gate barrier layer 43 of the NMOS gate structure 40 positioned at the uppermost level may surround bottom and side surfaces of the NMOS outer gate electrode 44 in a U-shape. The NMOS gate insulating layer 42 of the NMOS gate structure 40 positioned at the uppermost level may surround bottom and side surfaces of the NMOS gate barrier layer 43 in a U-shape. The NMOS interfacial insulating layer 41 may include, for example, oxidized silicon. For example, the NMOS interfacial insulating layer 41 may be formed by oxidizing surfaces of the MOS channel patterns 20n and the surface of the substrate 10. The NMOS gate insulating layer 42 may include a high-k insulator containing at least one of hafnium (Hf) or zirconium (Zr) such as, for example, hafnium oxide (HfO), hafnium oxynitride (HfON), hafnium silicon oxide (HfSiO), hafnium silicon oxynitride (HfSiON), zirconium oxide (ZrO), zirconium oxynitride (ZrON), zirconium Hafnium (Hf), silicon oxide (ZrSiO), zirconium silicon oxynitride (ZrSiON), hafnium zirconium oxide (HfZrO), hafnium zirconium oxynitride (HfZrON), hafnium zirconium silicon oxide (HfZrSiO), and hafnium zirconium silicon oxynitride (HfZrSiON). The NMOS gate barrier layer 43 may include a barrier metal such as, for example, titanium nitride (TiN). The NMOS outer gate electrode 44 may include a metal, metal alloy, or metal compound for adjusting the work function of the NMOS gate electrode 44. For example, the NMOS outer gate electrode 44 may include titanium aluminum (TiAl). The NMOS inner gate electrode 45 may include a metal or a metal compound. For example, the NMOS inner gate electrode 45 may include tungsten (W), titanium nitride (TiN), or various metal alloys. A central portion of a top surface of the NMOS channel pattern 20n contacting the NMOS interfacial insulating layer 41 of the NMOS channel pattern 20n positioned at the uppermost level and the top surface of the substrate 10 contacting the NMOS interfacial insulating layer 41 of the NMOS channel pattern 20n positioned at the lowermost level may be recessed.

The PMOS transistor structure 200 may include PMOS source/drain regions SDp, a plurality of PMOS channel patterns 20p, and a plurality of PMOS gate structures 50 disposed on the substrate 10 of the PMOS area PA. The PMOS source/drain regions SDp may include a P-type semiconductor layer. For example, the PMOS source/drain regions SDp may include, for example, silicon germanium (SiGe) layer including boron (B) (i.e., SiGe:B). The plurality of PMOS channel patterns 20p and the plurality of PMOS gate structures 50 may be alternately and repeatedly stacked in the vertical direction. Each of the plurality of PMOS channel patterns 20p may include a first silicon layer 22, a silicon germanium layer 23, and a second silicon layer 24 sequentially stacked. Each of the plurality of PMOS gate structures 50 may include a PMOS interfacial insulating layer 51, a PMOS gate insulating layer 52, and a PMOS gate electrode 54. The PMOS gate insulating layer 52 may surround top, bottom, and side surfaces of the PMOS gate electrode 54. The PMOS interfacial insulating layer 51 may surround top, bottom, and side surfaces of the PMOS gate insulating layer 52. The PMOS gate insulating layer 52 of the PMOS gate structure 50 positioned at the uppermost level may surround bottom and side surfaces of the PMOS gate electrode 54 in a U-shape. The PMOS interfacial insulating layer 51 may include, for example, oxidized silicon. For example, the PMOS interfacial insulating layer 51 may be formed by oxidizing a bottom surface of the first silicon layers 22, a top surface of the second silicon layers 24, inner side surfaces of the PMOS source/drain regions SDp, and the surface of the substrate 10. The PMOS gate insulating layer 52 may include a high-k insulator containing at least one of hafnium (Hf) or zirconium (Zr) such as, for example, hafnium oxide (HfO), hafnium oxynitride (HfON), hafnium silicon oxide (HfSiO), hafnium silicon oxynitride (HfSiON), zirconium oxide (ZrO), zirconium oxynitride (ZrON), zirconium Hafnium (Hf) as silicon oxide (ZrSiO), zirconium silicon oxynitride (ZrSiON), hafnium zirconium oxide (HfZrO), hafnium zirconium oxynitride (HfZrON), hafnium zirconium silicon oxide (HfZrSiO), and hafnium zirconium silicon oxynitride (HfZrSiON). The PMOS gate electrode 54 may include a barrier metal such as, for example, titanium nitride (TiN). When the PMOS gate electrode 54 includes a barrier metal, the gate barrier layer may be omitted. In an embodiment, the PMOS gate electrode 54 may include a PMOS gate barrier layer and a PMOS gate electrode. In an embodiment, the PMOS gate electrode 54 may include a PMOS gate barrier layer, a PMOS outer gate electrode, and a PMOS inner gate electrode. The PMOS gate barrier layer may include a barrier metal layer. The PMOS outer gate electrode may include a metal layer, a metal alloy layer, or a metal compound layer for adjusting a work function of the PMOS gate electrode. A central portion of a top surface of the second silicon layer 24 of the PMOS channel pattern 20p contacting the PMOS interfacial insulating layer 51 of the PMOS gate structure 50 positioned at the uppermost level may be recessed. The surface of the substrate 10 contacting the PMOS interfacial insulating layer 51 of the PMOS gate structure 50 positioned at the lowermost level may not be recessed.

Each of the NMOS gate structures 40 may have a first gate thickness TG1 in the vertical direction. Each of the PMOS gate structures 50 may have a second gate thickness TG2 in the vertical direction. The first gate thickness TG1 may be greater than the second gate thickness TG2. For example, a resistance of the NMOS gate structure 40 may be less than a resistance of the PMOS gate structure 50. When the NMOS gate structure 40 includes more conductive layers than the PMOS gate structure 50, the first gate thickness TG1 of the NMOS gate structure 40 may be greater than the second gate thickness TG2 of the PMOS gate structure 50. Each of the NMOS channel patterns 20n may have a first channel thickness TC1 in the vertical direction. Each of the PMOS channel patterns 20p may have a second channel thickness TC2 in the vertical direction. The first channel thickness TC1 may be smaller (also referred to herein as thinner) than the second channel thickness TC2. Each of the NMOS channel patterns 20n may be a single layer. Each of the PMOS channel patterns 20p may be multiple layers. For example, the second channel thickness TC2 of the PMOS channel patterns 20p may be greater than the first channel thickness TC1 of the NMOS channel patterns 20n. For example, the NMOS channel patterns 20n and the second silicon layers 24 of the PMOS channel patterns 20p may be formed at the same level, respectively. The first channel thickness TC1 of the NMOS channel patterns 20n may be smaller than the second channel thickness TC2 of the second silicon layers 24 of the PMOS channel patterns 20p.

During a manufacturing process, the surfaces of the NMOS channel patterns 20n may be oxidized and removed. The surfaces of the second silicon layers 24 of the PMOS channel patterns 20p may not be removed. Each of the PMOS channel patterns 20p may include, for example, silicon layers 22 and 24, and a silicon germanium layer 23 interposed between the silicon layers 22 and 24. For example, the silicon layers 22 and 24 of each of the PMOS channel patterns 20p may receive lattice stress by the silicon germanium layers 23. Carrier mobility of the PMOS channel patterns 20p may, thus, be improved.

Figure 3:
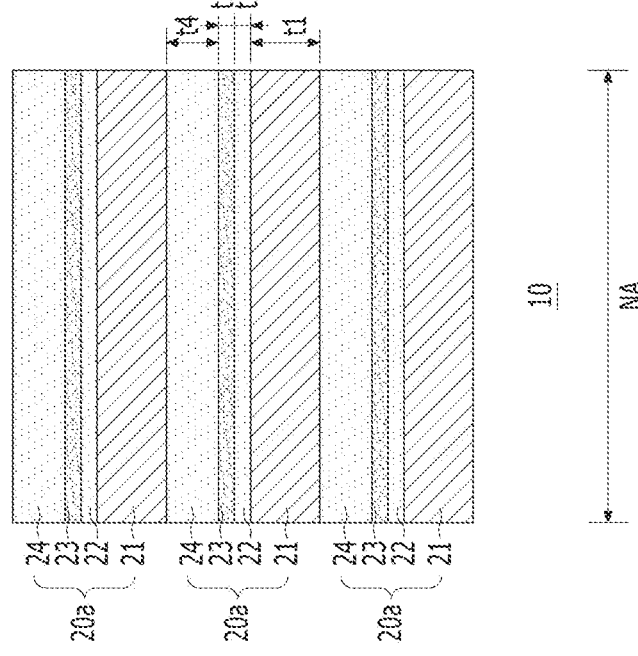

FIGS. 3 to 16 are longitudinal cross-sectional views taken along lines I-I' and II-II' of FIG. 1 illustrating a method of manufacturing a semiconductor device according to an embodiment of the present disclosure. Referring to FIG. 3, a method of manufacturing a semiconductor device according to an embodiment of the present disclosure may include repeatedly stacking preliminary channel layers 20a by performing deposition processes. Each of the preliminary channel layers 20a may include a sacrificial layer 21, a first silicon layer 22, a silicon germanium layer 23, and a second silicon layer 24. In the illustrated embodiment, three layers of preliminary channel layers 20a are shown, but four or more layers of preliminary channel layers 20a may also be formed. The sacrificial layers 21 may include, for example, germanium-rich silicon germanium layer. For example, each of the sacrificial layers 21 may include a silicon germanium layer SixGey layer where x and y are real numbers satisfying the following conditions:

$$0 < x < y, \text{ and}$$

$$x + y = 1.$$

Hence, the sacrificial layers 21 may contain more germanium than silicon. In an embodiment, the sacrificial layers 21 may contain germanium greater than 50 atomic % (or silicon less than 50 atomic %). That is, an atomic percentage of the germanium may be higher than an atomic percentage of the silicon in the sacrificial layers 21. Each of the first silicon layers 22 may include a single crystalline silicon layer. Each of the silicon germanium layers 23 may include a silicon-rich silicon germanium layer. For example, the silicon germanium layers 23 may include SivGez layer where v and z are real numbers satisfying the following conditions:

$$v > z > 0, \text{ and}$$

$$v + z = 1,$$

In an embodiment, silicon germanium layers 23 may include silicon greater than 75 atomic % (or germanium less than 25 atomic %). That is, an atomic percentage of the silicon may be higher than an atomic percentage of the germanium in the silicon germanium layers 23. Each of the second silicon layers 24 may include a single crystalline silicon layer. Each of the sacrificial layers 21, the first silicon layers 22, the silicon germanium layers 23, and the second silicon layers 24 may be formed by performing, for example, by an epitaxial growth process. The sacrificial layers 21 may have a first thickness t1 in the vertical direction. The first silicon layers 22 may have a second thickness t2 in the vertical direction. The silicon germanium layers 23 may have a third thickness t3 in the vertical direction. The second silicon layers 24 may have a fourth thickness t4 in the vertical direction. The first thickness t1 may be the greatest of the four, (also referred to as the thickest), i.e., the t1 is greater than the t2, t3, and t4. The second thickness t2 and the third thickness t3 may be the least of four, (also referred to as the thinnest), i.e., the t2 and t3 are thinner than the t1 and t4. The second thickness t2 and the third thickness t3 may be the same or substantially the same with each other. The fourth thickness t4 may be thinner than the first thickness t1 and greater than the second and third thicknesses t2 and t3. In an embodiment, the first thickness t1 may be about 8 to 12 nm, the second thickness t2 and the third thickness t3 may be about 2 to 5 nm, and the fourth thickness t4 may be 6-10 nm.

Figure 4:
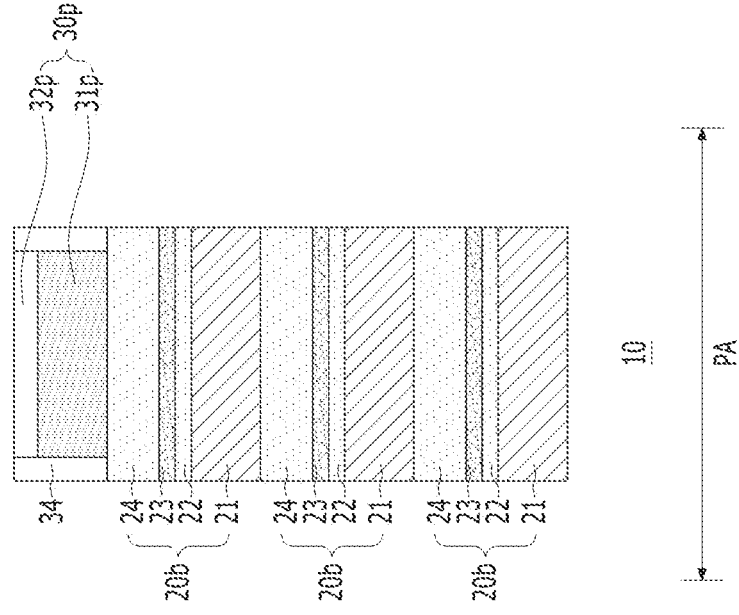
Figure 4:
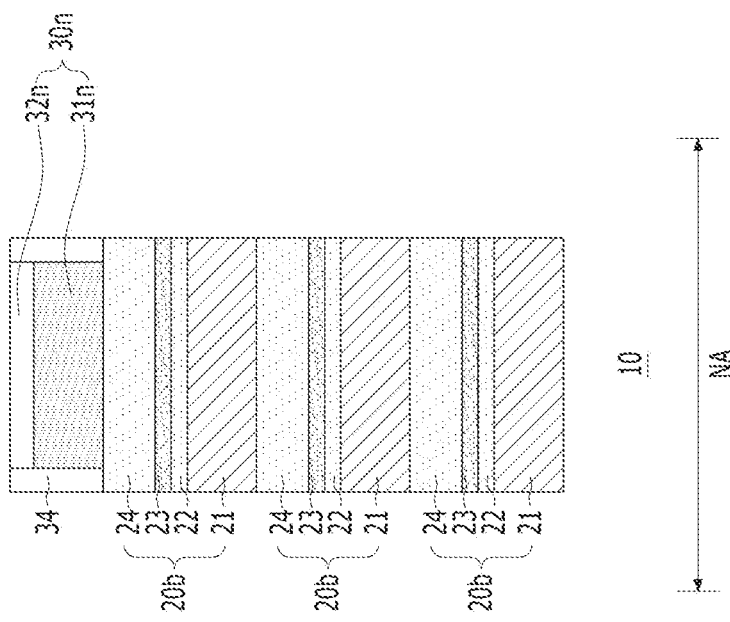

Referring to FIG. 4, the method may further include forming dummy gate structures 30n and 30p and spacers 34 on the preliminary channel layers 20a by performing one or more deposition processes and an etching process, and forming preliminary channel patterns 20b by performing a patterning process using the dummy gate structures 30n and 30p and the spacers 34 as a pattering mask. The dummy gate structures 30n and 30p may include dummy gate electrodes 31n and 31p and dummy gate capping layers 32n and 32p, respectively. The dummy gate electrodes 31n and 31p may include, for example, polycrystalline silicon. The dummy gate capping layers 32n and 32p and the spacers 34 may have an etch selectivity with respect to silicon oxide. For example, the dummy gate capping layers 32n and 32p and the spacers 34 may include silicon nitride. In an embodiment, a buffer insulating layer (not shown) may be further formed between the second silicon layer 24 of the preliminary channel patterns 20b positioned at the uppermost level and the dummy gate electrodes 30n and 30p. The buffer insulating layer may include, for example, silicon oxide, silicon nitride, or a combination thereof.

Figure 5:
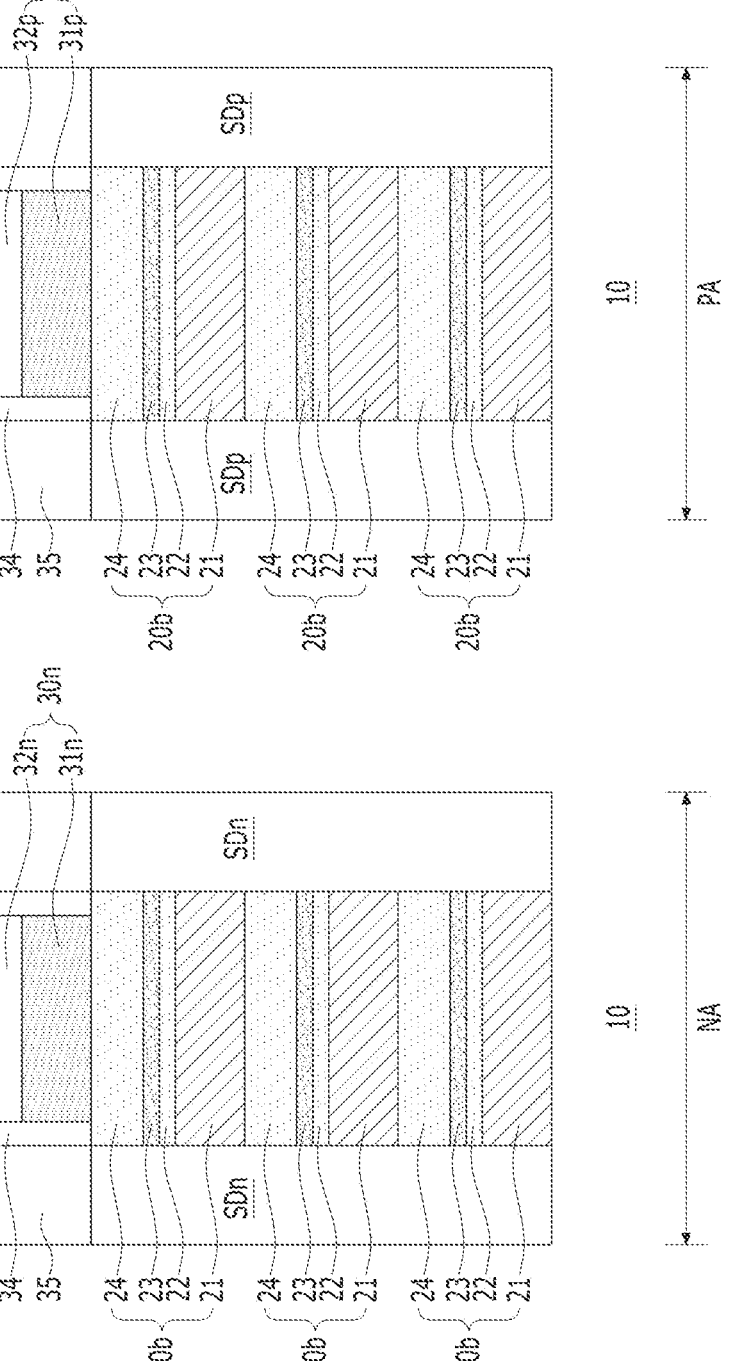

Referring to FIG. 5, the method may further include forming source/drain regions SDn and SDp and an interlayer insulating layer 35 by performing, for example, an epitaxial growth process and a deposition process. The source/drain regions SDn and SDp may include NMOS source/drain regions SDn and PMOS source/drain regions SDp. The NMOS source/drain regions SDn may include, for example, silicon layer containing phosphorus (Si:P). The PMOS source/drain regions SDp may include, for example, silicon germanium layer including boron (SiGe:B). The interlayer insulating layer 35 may include, for example, silicon oxide, silicon nitride, or a combination thereof. Forming the interlayer insulating layer 35 may include, for example, performing one or more deposition processes or a spin coating process.

Figure 6:
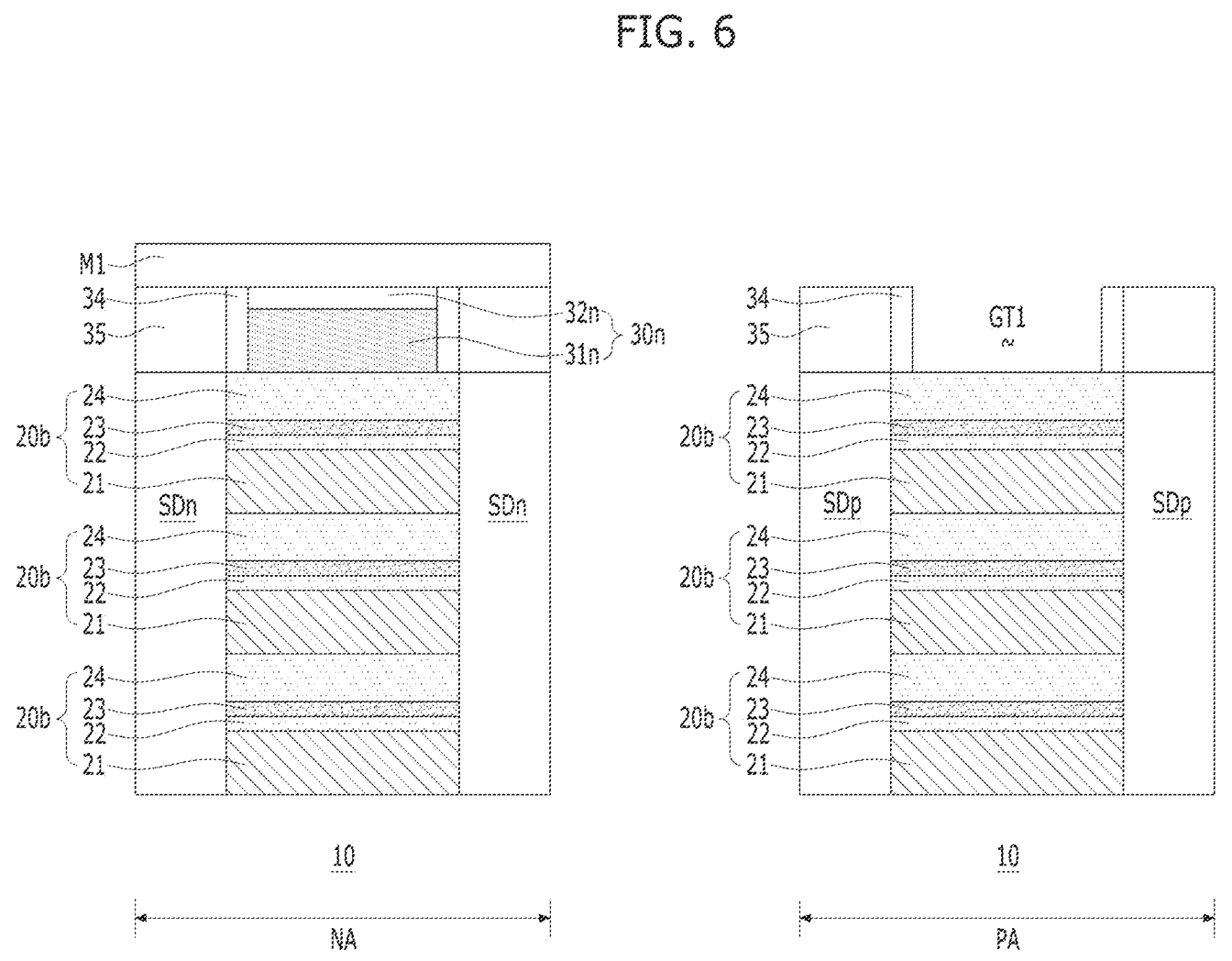

Referring to FIG. 6, the method may further include forming a first mask pattern M1 covering the NMOS area NA and exposing the PMOS area PA by performing a photolithography process and an etching process, and forming a first gate trench GT1 between the spacers 34 by removing the PMOS dummy gate structure 30p in the PMOS area PA. A top surface of the second silicon layer 24 of the preliminary channel pattern 20b positioned at the uppermost level may be exposed in the first gate trench GT1. The first mask pattern M1 may include, for example, silicon oxide, silicon nitride, or a combination thereof. In an embodiment, the first mask pattern M1 may include a polymeric organic material such as a photoresist.

Figure 7:
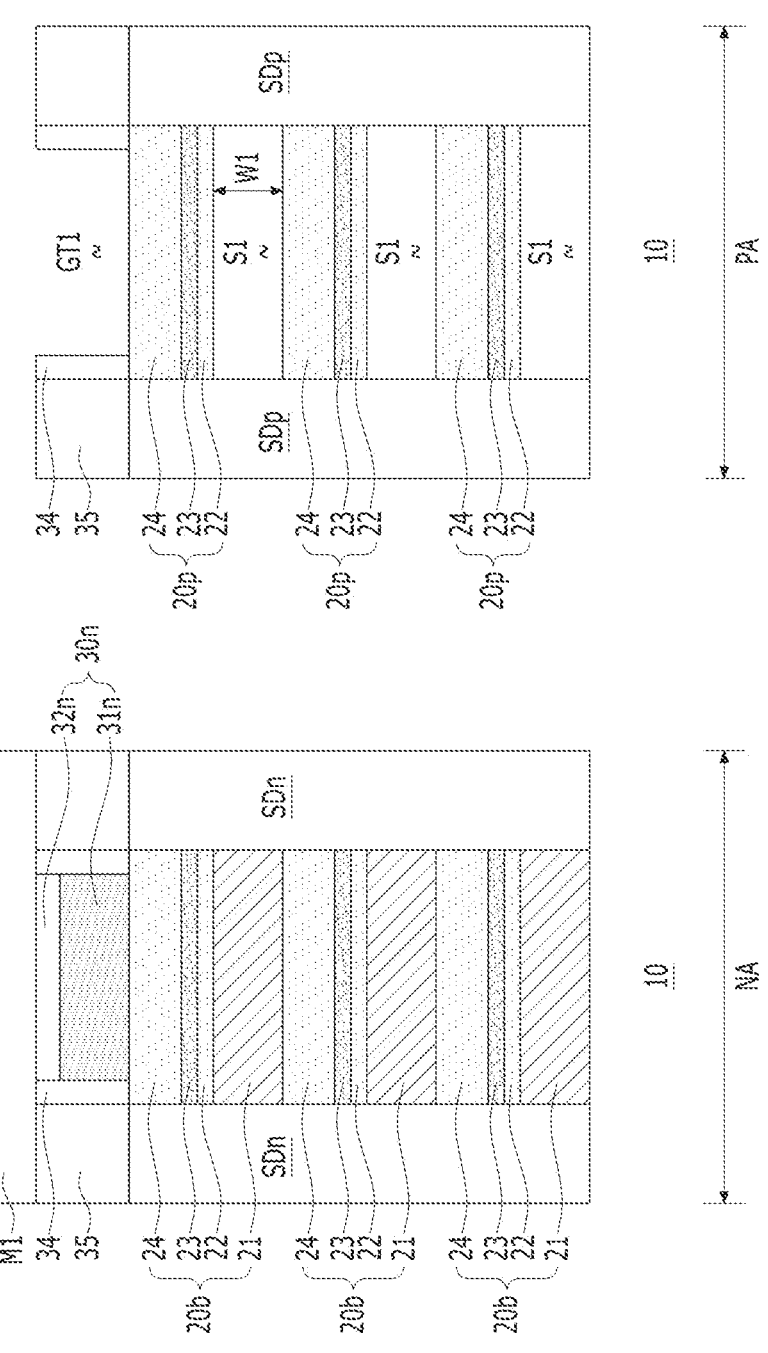

Referring to FIG. 7, the method may further include forming first spaces S1 by removing the sacrificial layers 21 in the PMOS area PA by performing an etching process. In the illustrated embodiment, the sacrificial layers 21 and the silicon germanium layers 23 may have different silicon concentrations and germanium concentrations from each other. For example, the sacrificial layers 21 and the silicon germanium layers 23 may have an etch selectivity with each other. The top surface of the substrate 10, bottom surfaces of the first silicon layers 22, top surface of the second silicon layers 24, and inner surfaces of the PMOS source/drain regions SDp may be exposed in the first spaces S1. The preliminary channel patterns 20b may be formed into PMOS channel patterns 20p, each of the PMOS channel patterns 20p including the first silicon layer 22, the silicon germanium layer 23, and the second silicon layer 24 by removing the sacrificial layers 21. The first spaces S1 may have a first vertical width W1 corresponding to the vertical thickness t1 of the sacrificial layers 21 between the top surfaces of the second silicon layers 24 and bottom surfaces of the first silicon layers 22.

Figure 8:
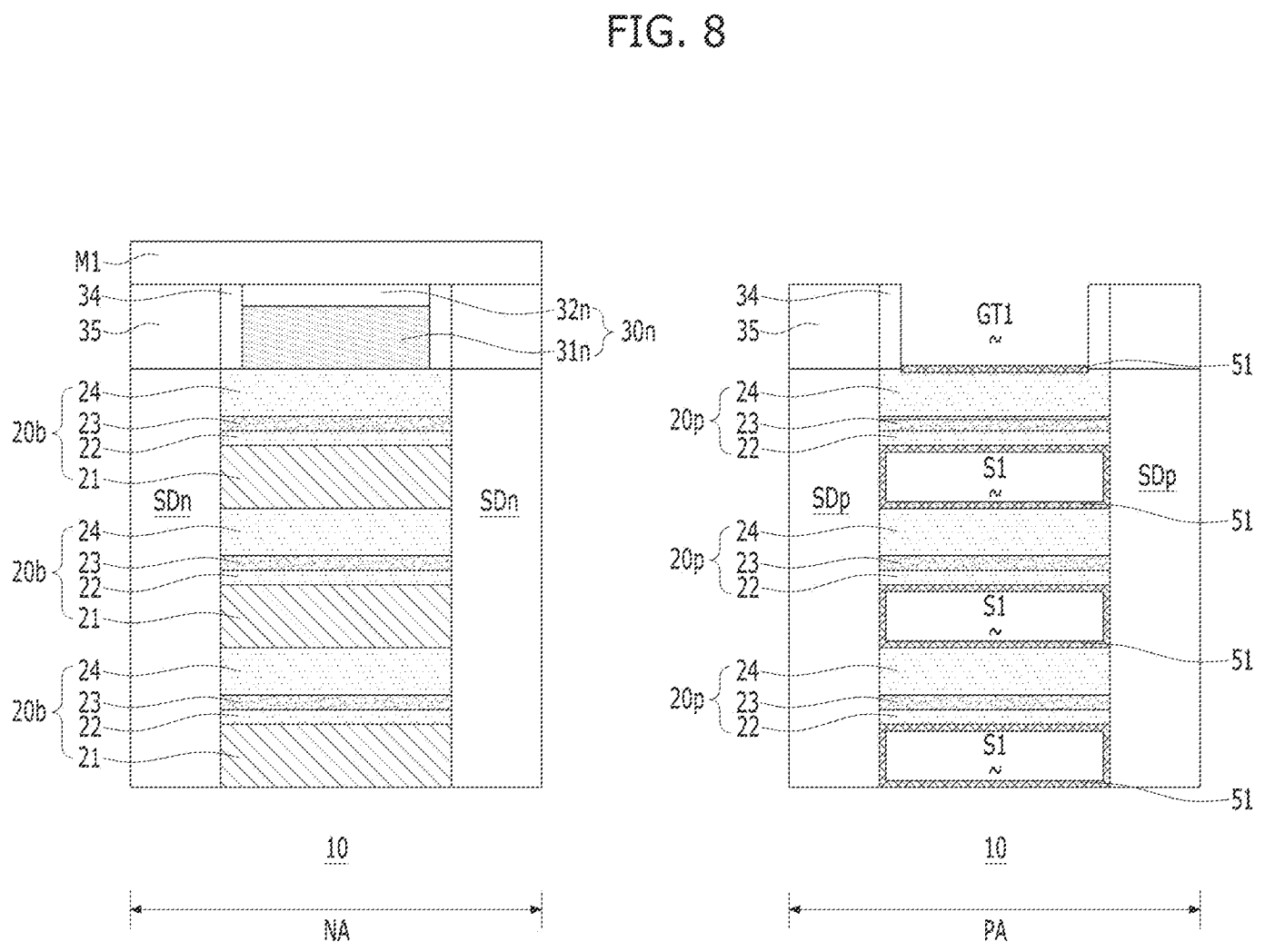

Referring to FIG. 8, the method may further include forming a plurality of PMOS interfacial insulating layers 51 on a top surface of the substrate 10, the bottom surfaces of the first silicon layers 22, the top surfaces of the second silicon layers 24, and inner surfaces of the PMOS source/drain regions SDp which are exposed in the first gate trench GT1 and the first spaces S1 in the PMOS area PA by performing one or more oxidation processes. Accordingly, the PMOS interfacial insulating layers 51 may include oxidized silicon layers.

Figure 9:
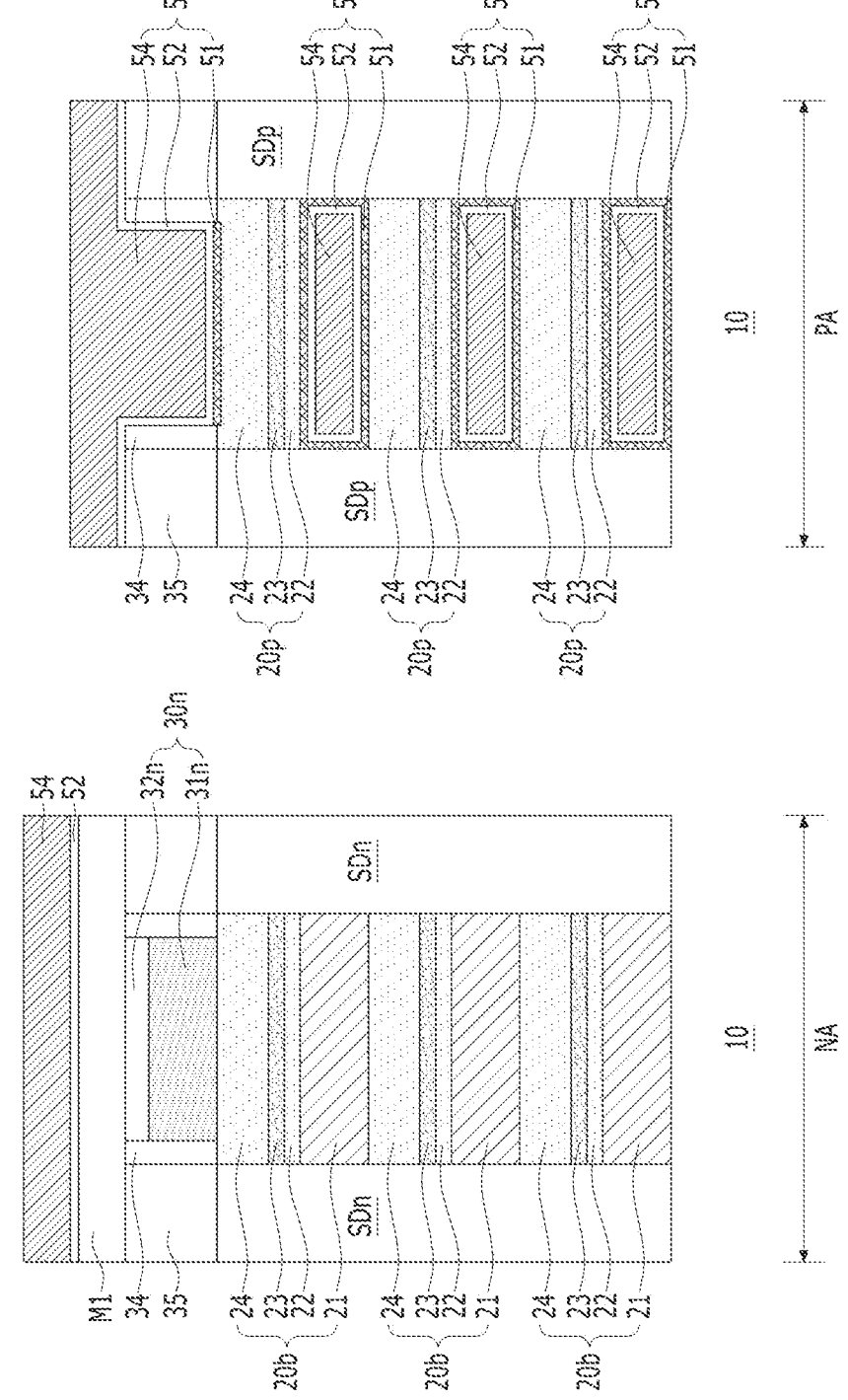

Referring to FIG. 9, the method may further include forming a plurality of PMOS gate insulating layers 52 and a plurality of corresponding PMOS gate electrodes 54 on the PMOS interfacial insulating layers 51 in the first gate trench GT1 and the first spaces S1 in the PMOS area PA to form a plurality of PMOS gate electrode structures 50 by performing deposition processes which are well-known in the art and, therefore need not be described in more detail. Forming the plurality of PMOS gate insulating layers 52 may include conformally forming a plurality of high-k insulating layers on the corresponding plurality of PMOS interfacial insulating layers 51. The plurality of the high-k insulating layers may each include an insulating material comprising hafnium (Hf) and/or zirconium (Zr) such as, for example, hafnium oxide (HfO), hafnium oxynitride (HfON), hafnium silicon oxide (HfSiO), hafnium silicon oxynitride (HfSiON), zirconium oxide (ZrO), zirconium oxynitride (ZrON), zirconium silicon oxide (ZrSiO), zirconium silicon oxynitride (ZrSiON), hafnium zirconium oxide (HfZrO), hafnium zirconium oxynitride (HfZrON), hafnium zirconium silicon oxide (HfZrSiO), hafnium zirconium silicon oxynitride (HfZrSiON) and any combination thereof. Forming the plurality of the PMOS gate electrodes 54 may include forming a metal compound such as, for example, titanium nitride (TiN) on the corresponding plurality of the PMOS gate insulating layers 52 by performing one or more deposition processes. Each of the plurality of the PMOS gate electrodes 54 may completely fill a corresponding one of the plurality of the first spaces S1. In an embodiment, forming each of the plurality of the PMOS gate electrodes 54 may include forming a plurality of multiple metal layers, metal alloy layers, or metal compound layers or any combination thereof. In the NMOS area NA, the plurality of the PMOS gate insulating layers 52 and the plurality of the PMOS gate electrodes 54 may also be formed on the first mask pattern M1.

Figure 10:
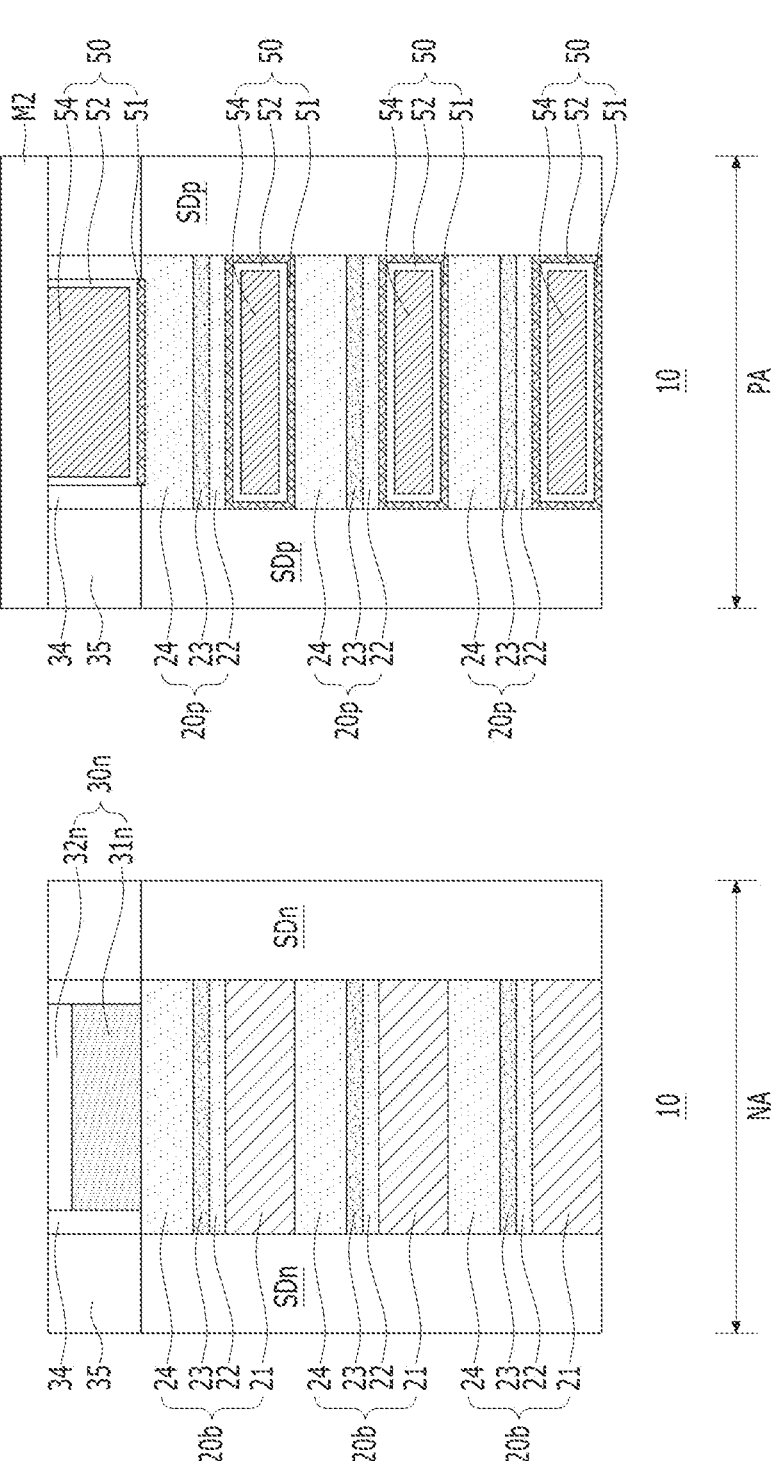

Referring now to FIG. 10, the method may further include removing each PMOS gate insulating layer 52 and each PMOS gate electrode 54 which are on the interlayer insulating layer 35 in the PMOS area PA by performing one or more etching processes and/or one or more planarization processes, and forming a second mask pattern M2 covering the PMOS area PA and exposing the NMOS area NA by performing a photolithography process. The second mask pattern M2 may include, for example, silicon oxide, silicon nitride, or any combination thereof. In an embodiment, the second mask pattern M2 may include a polymeric organic material.

Figure 11:
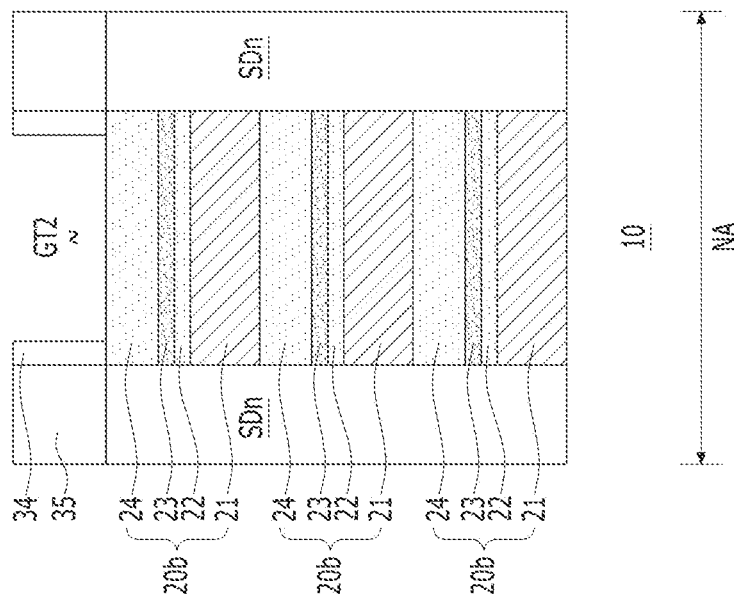

Referring to FIG. 11, the method may further include forming a second gate trench GT2 by removing the NMOS dummy gate structure 30n in the NMOS area NA. A top surface of the second silicon layer 24 of the preliminary channel pattern 20b positioned at the uppermost level may be exposed in the second gate trench GT2.

Figure 12:
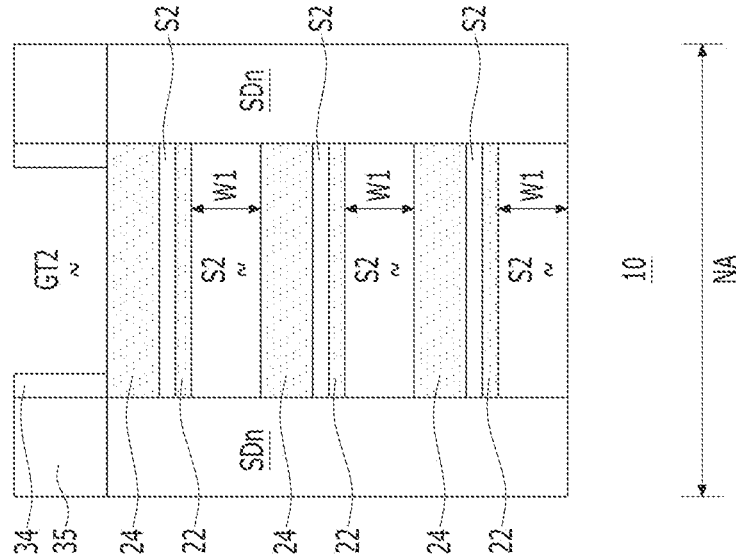

Referring to FIG. 12, the method may further include forming second spaces S2 by removing the sacrificial layers 21 and the silicon germanium layers 23 in the NMOS area NA. The second spaces S2 may be formed between the top surface of the substrate 10 and a bottom surface of the first silicon layer 22 positioned at the lowermost level, between top surfaces of the first silicon layer 22 and bottom surfaces of the second silicon layers 24, and between top surfaces of the second silicon layers 24 and bottom surfaces of the first silicon layers 22. The top surface of the substrate 10, the top and bottom surfaces of the first silicon layer 22, the top and bottom surfaces of the second silicon layer 24, and inner surfaces of the NMOS source/drain regions SDn may be exposed in the second spaces S2. The second spaces S2 may also have a first vertical width W1 corresponding to the vertical thickness t1 of the sacrificial layers 21 between the top surface of the second silicon layers 24 and the bottom surface of the first silicon layers 22.

Figure 13:
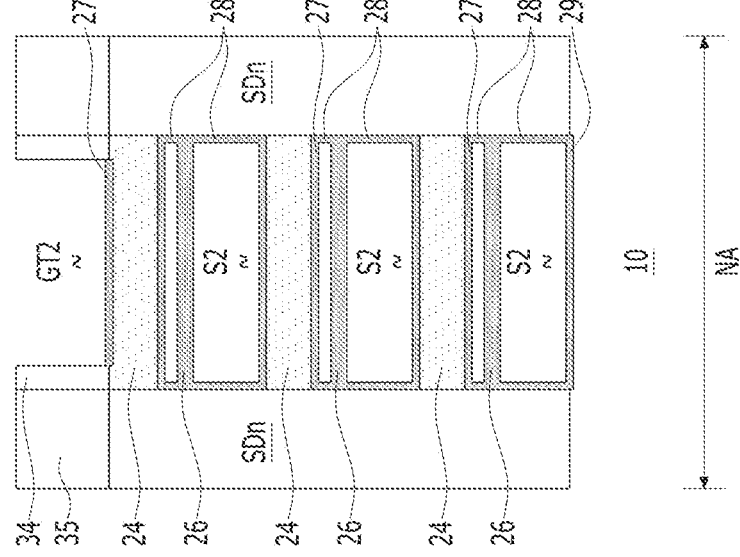

Referring to FIG. 13, the method may further include forming a plurality of oxidized silicon layers 26, 27, 28, and 29 on the surface of the substrate 10, the top and bottom surfaces of the first silicon layers 22, the top and bottom surfaces of the second silicon layers 24, and the inner surfaces of the NMOS source/drain regions SDn exposed in the second spaces S2 and the second gate trench GT2 by performing one or more oxidation processes. For example, the first silicon layers 22 may be fully oxidized to be formed into first silicon oxide layers 26, and the second silicon oxide layers 27 may be formed on the top and bottom surfaces of the second silicon layers 24, source/drain oxide layers 28 may be formed on the inner surfaces of the NMOS source/drain regions SDn, and a substrate oxide layer 29 may be formed on the surface of the substrate 10.

Figure 14:
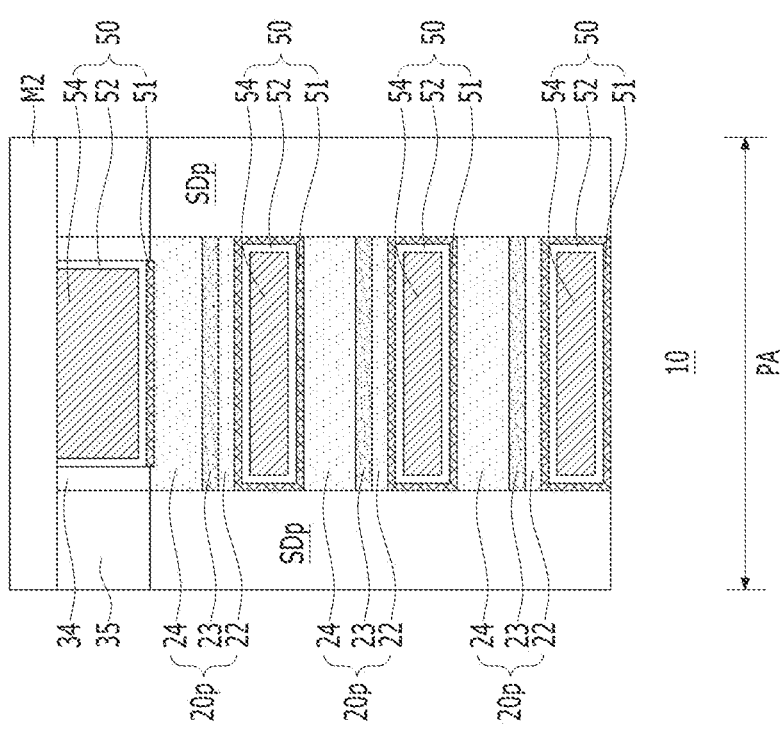
Figure 14:
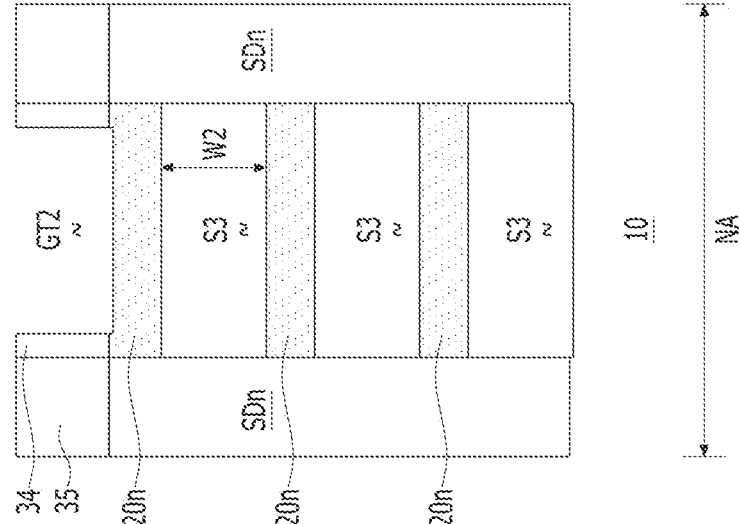

Referring to FIG. 14, the method may further include removing the first silicon oxide layers 26, the second silicon oxide layers 27, the source/drain oxide layers 28, and the substrate oxide layer 29 by performing an oxide removal process. The second silicon layers 24 may be formed into NMOS channel patterns 20n. As the first silicon oxide layers 26 are removed, the second spaces S2 may be expanded to form third spaces S3. Top and bottom surfaces of the NMOS channel patterns 20n, the inner surfaces of the NMOS source/drain regions SDn, and the top surface of the substrate 10 may be exposed in the third spaces S3. Referring again to FIG. 12, the second spaces S2 may have a first vertical width W1 corresponding to the thickness t1 of the sacrificial layers 21, the third spaces S3 may have a second vertical width W2 corresponding to the sum of the thickness t1 of the sacrificial layers 21, the thickness t2 of the first silicon layers 22, and the thickness t3 of the silicon germanium layers 23. For example, the second vertical width W2 may be greater than the first vertical width W1.

Figure 15:
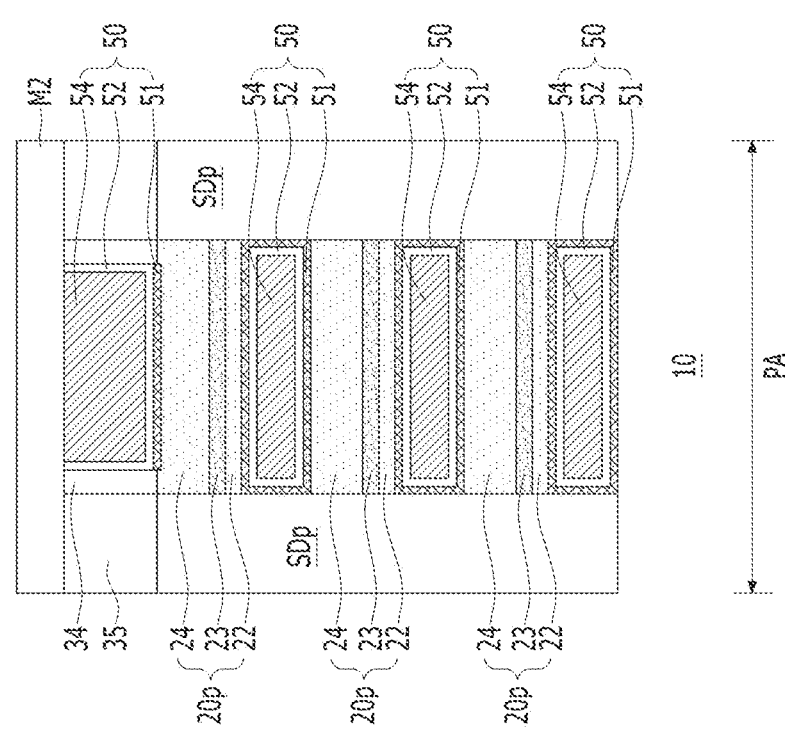
Figure 15:
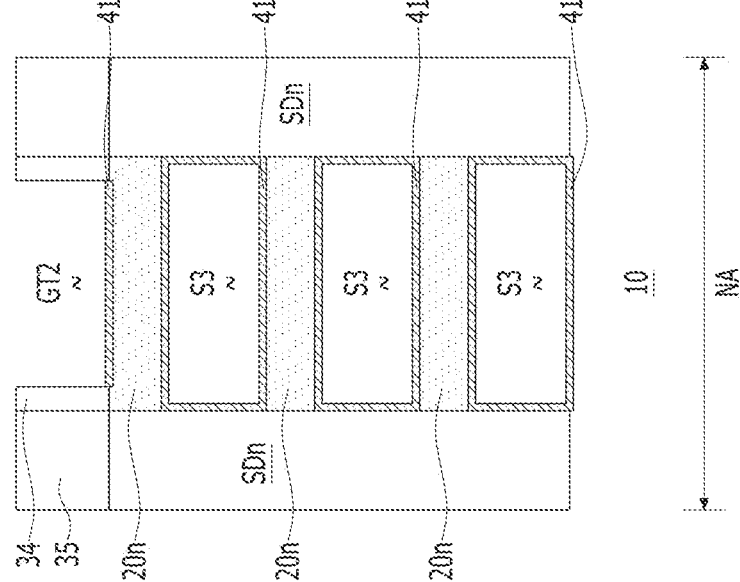

Referring to FIG. 15, the method may further include forming NMOS interfacial insulating layers 41 on surfaces of the NMOS channel patterns 20n, the surface of the NMOS source/drain regions SDn, the surface of the substrate 10 exposed in the third spaces S3 of the NMOS area NA by performing one or more oxidation processes. For example, the NMOS interfacial insulating layers 41 may include, for example, an oxidized silicon layer.

Figure 16:
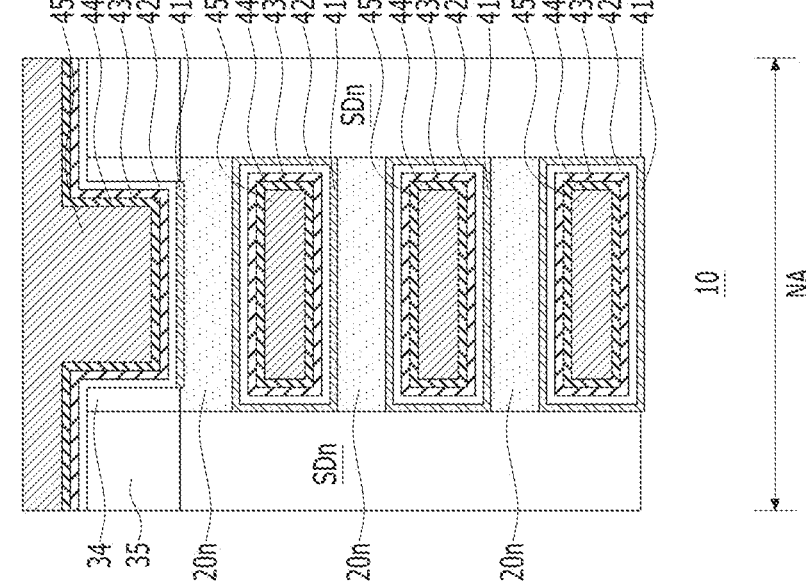

Referring to FIG. 16, the method may further include forming NMOS gate insulating layers 42, NMOS gate barrier layers 43, NMOS outer gate electrodes 44, and NMOS inner gate electrodes 45 on the NMOS interfacial insulating layers 41 in the second gate trench GT2 and the third spaces S3 in the NMOS area NA. Forming the NMOS gate insulating layers 42 may include conformally forming high-k insulating layers on the NMOS interfacial insulating layers 41 by performing one or more deposition processes. The high-k insulating layers may include the same material as the PMOS gate insulating layers 52. For example, the NMOS gate insulating layers 42 may include insulating layers including at least one of hafnium (Hf) or zirconium (Zr) such as, for example, hafnium oxide (HfO), hafnium oxynitride (HfON), hafnium silicon oxide (HfSiO), hafnium silicon oxynitride (HfSiON), zirconium oxide (ZrO), zirconium oxynitride (ZrON), zirconium silicon oxide (ZrSiO), zirconium silicon oxynitride (ZrSiON), hafnium zirconium oxide (HfZrO), hafnium zirconium oxynitride (HfZrON), hafnium zirconium silicon oxide (HfZrSiO), or hafnium zirconium silicon oxynitride (HfZrSiON). Forming the NMOS gate barrier layers 43 may include conformally forming barrier metal layers such as, for example, titanium nitride (TiN) on the NMOS gate surface insulating layers 42 by performing one or more deposition processes. Forming the NMOS outer gate electrodes 44 may include conformally forming one or more work function control metal layers on the NMOS gate barrier layers 43 by performing one or more deposition processes. For example, the one or more work function control metal layers may be made of any suitable metal material including a metal alloy such as titanium aluminum (TiAl). Forming the NMOS inner gate electrodes 45 may include forming one or more metal compound layers or metal layers or metal alloy layers or any combination thereof on the NMOS outer gate electrodes 44 by performing one or more deposition processes. For example, the NMOS inner gate electrodes 45 may be made of a metal compound or a metal including titanium nitride (TiN) or tungsten (W), or a metal alloy. The NMOS inner gate electrodes 45 may completely fill the third spaces S3.

Thereafter, further referring to FIG. 2, the method may further include removing the NMOS gate insulating layers 42, the NMOS gate barrier layers 43, the NMOS outer layers 44, and the NMOS inner gate electrodes 45 on the interlayer insulating layer 35 in the NMOS area NA and removing the NMOS gate insulating layers 42, the NMOS gate barrier layers 43, and the NMOS outer gate electrodes 44, the NMOS inner gate electrodes 45, and the second mask pattern M2 on the interlayer insulating layer 35 in the PMOS area PA by performing by performing an etching process or a planarization process, and forming a gate capping layer 36 in the NMOS area NA and the PMOS area PA by performing one or more deposition processes. The gate capping layer 36 may include a silicon nitride-based material.

Figure 17:
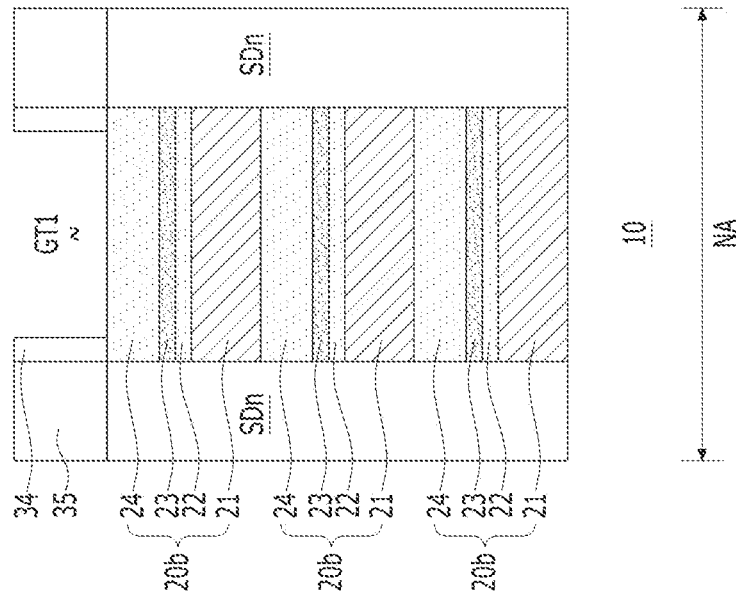

FIGS. 17 to 27 are longitudinal cross-sectional views taken along the lines I-I' and II-II' of FIG. 1 to describe a method of manufacturing a semiconductor device according to an embodiment of the present disclosure. Referring to FIG. 17, a method of manufacturing a semiconductor device according to an embodiment of the present disclosure may include performing the processes described with reference to FIGS. 3 to 5, forming a first mask pattern M1 covering the PMOS area PA and exposing the NMOS area NA by performing a photolithography process and an etching process, and forming a first gate trench GT1 between the spacers 34 by removing the NMOS dummy gate structure 30*n* in the NMOS area NA. A top surface of the second silicon layer 24 of the preliminary channel pattern 20*b* positioned at the uppermost level may be exposed in the first gate trench GT1. The first mask pattern M1 may include, for example, silicon oxide, silicon nitride, or a combination thereof. In an embodiment, the first mask pattern M1 may include a polymeric organic material.

Figure 18:
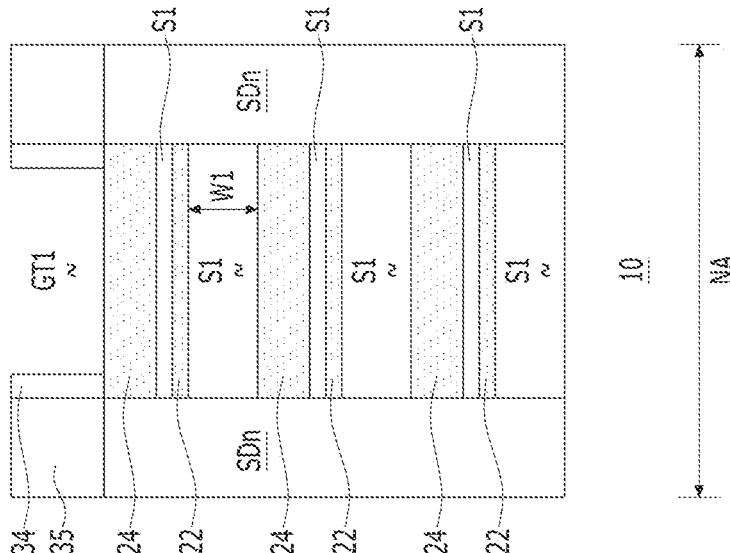

Referring to FIG. 18, the method may further include forming first spaces 51 by removing the sacrificial layers 21 and the silicon germanium layers 23 in the NMOS area NA by performing an etching process. The first spaces 51 may be formed between the top surface of the substrate 10 and the bottom surface of the first silicon layer 22 positioned at the lowermost level, between the top surfaces of the first silicon layers 22 and the bottom surfaces of the second silicon layers 24, and between the top surfaces of the second silicon layers 24 and the bottom surfaces of the first silicon layers 22. Between the top surface of each of the second silicon layers 24 and the bottom surface of each of the first silicon layers 22, each of the first spaces S1 may have a first vertical width W1 corresponding to the vertical thickness t1 of the sacrificial layers 21.

Figure 19:
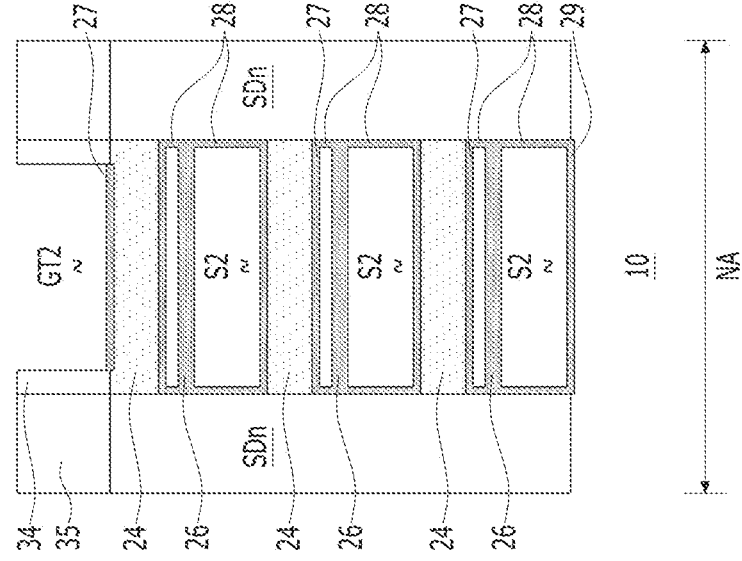

Referring to FIG. 19, the method may further include oxidizing the first silicon layers 22 to form the first silicon oxide layers 26, and the second silicon oxide layers 27 on the surfaces of the second silicon layers 26, oxidizing the surfaces of the NMOS source/drain regions SDn to form the source/drain oxide layers 28, and oxidizing the surface of the substrate 10 to form the substrate oxide layer 29 by performing one or more oxidation processes.

Figure 20:
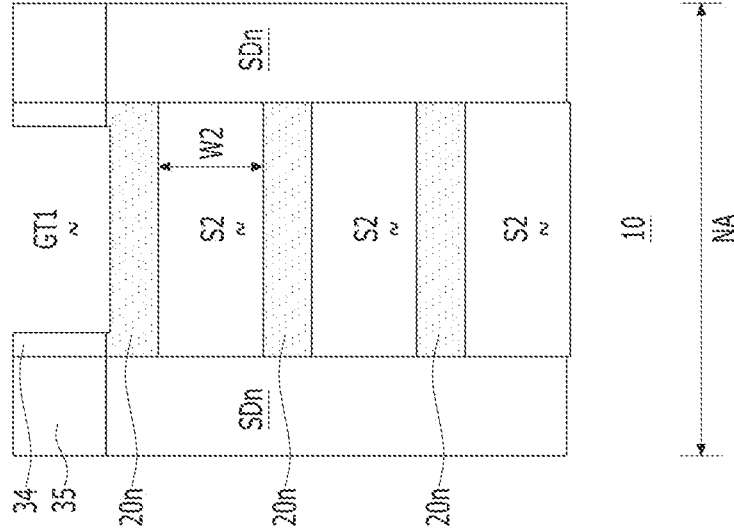

Referring to FIG. 20, the method may further include removing the first silicon oxide layers 26, the second silicon oxide layers 27, the source/drain oxide layers 28, and the substrate oxide layer 29 by performing an oxide removal process. Referring to FIGS. 18 and 20, the first spaces S1 may have the first vertical width W1 corresponding to the vertical thickness t1 of the sacrificial layers 21, and the second spaces S2 may have the second vertical width W2 corresponding to the sum of the thickness t1 of the sacrificial layers 21, the thickness t2 of the first silicon layers 22, and the thickness t3 of the silicon germanium layers 23. For example, the second vertical width W2 may be greater than the first vertical width W1.

Figure 21:
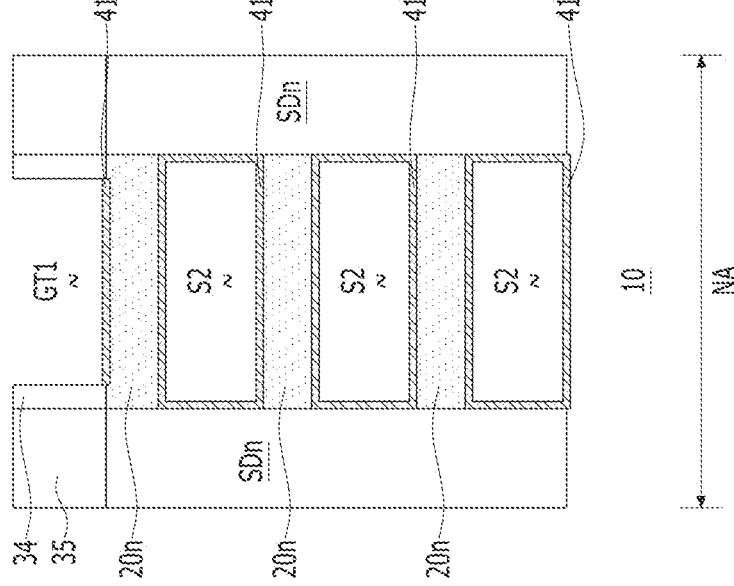

Referring to FIG. 21, the method may further include forming NMOS interfacial insulating layers 41 on the surfaces of the NMOS channel patterns 20*n*, the surfaces of the NMOS source/drain regions SDn, and the surface of the substrate 10 exposed in the second spaces S2 of the NMOS area NA by performing an oxidizing process. The NMOS interfacial insulating layers 41 may include, for example, oxidized silicon layers.

Figure 22:
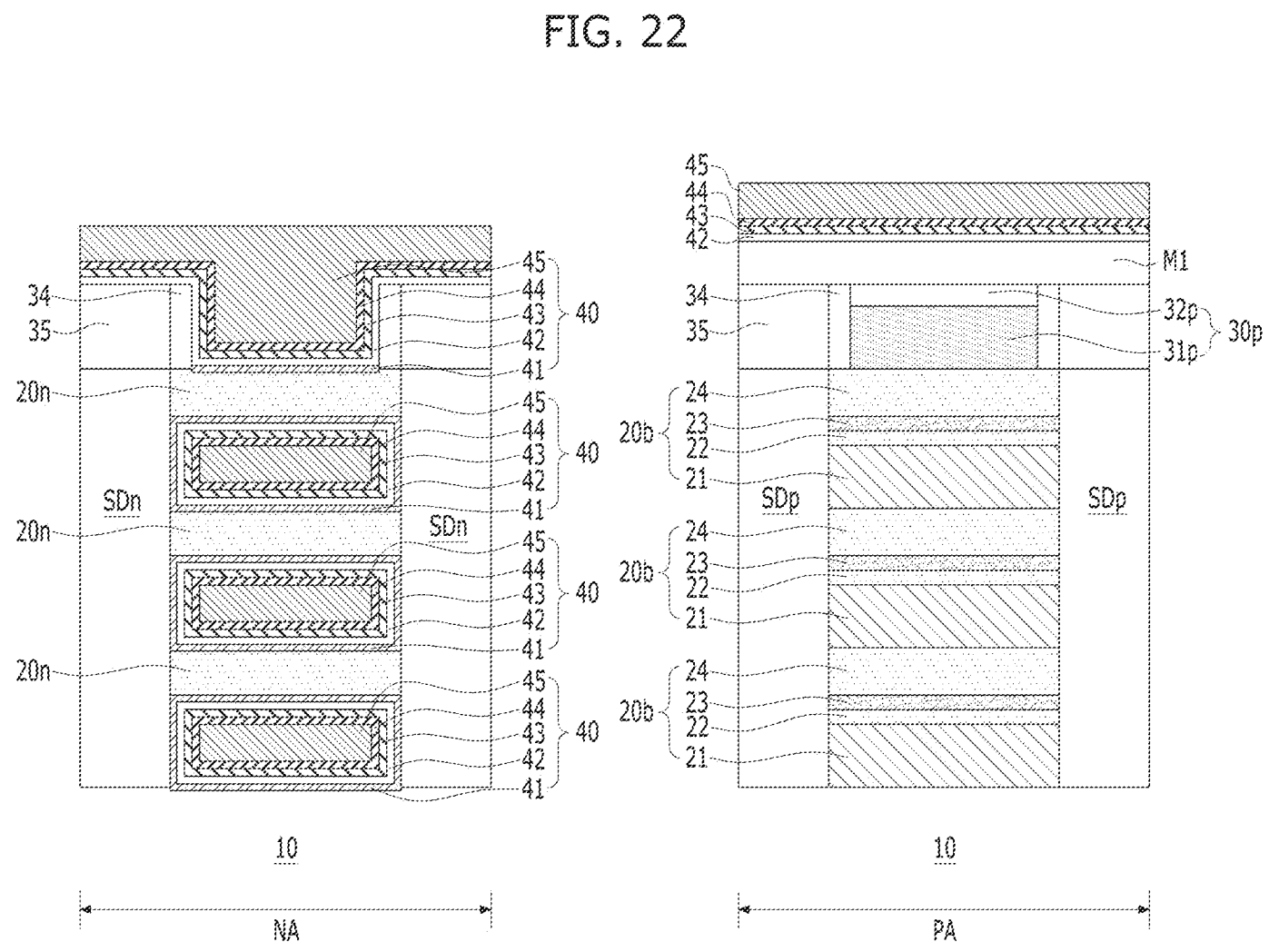

Referring to FIG. 22, the method may further include forming NMOS gate insulating layers 42, NMOS gate barrier layers 43, NMOS outer gate electrodes 44, and NMOS inner gate electrodes 45 on the NMOS interfacial insulating layers 41 in the first gate trench GT1 and the second spaces S2 in the NMOS area NA. The NMOS gate insulating layers 42, the NMOS gate barrier layers 43, the NMOS outer gate electrodes 44, and the NMOS inner gate electrodes 45 may also be formed on the first mask pattern M1 in the PMOS area PA.

Figure 23:
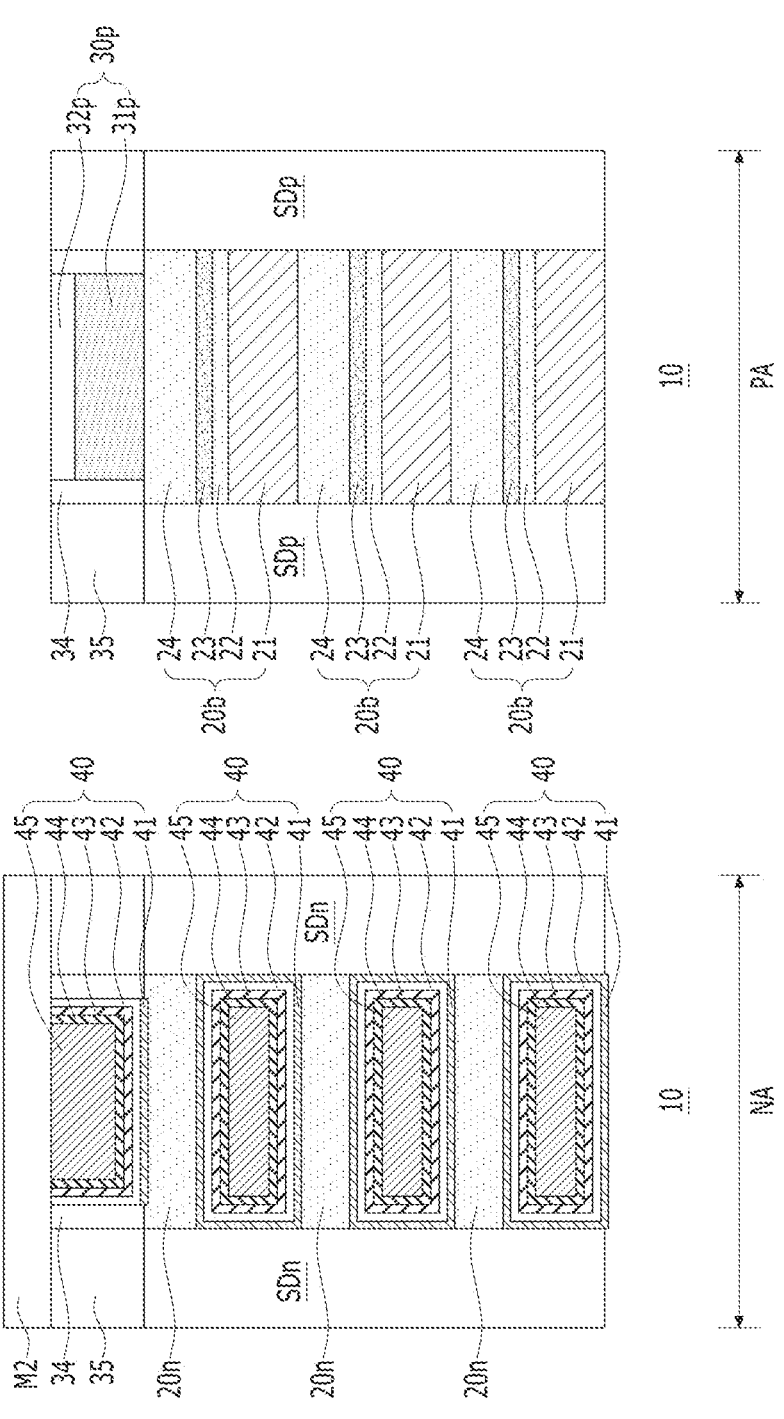

Referring to FIG. 23, the method may further include removing the NMOS gate insulating layer 42, the NMOS gate barrier layer 43, the NMOS outer gate electrode 44, and the NMOS inner gate electrode 45 on the interlayer insulating layer 35 in the NMOS area NA, and removing the NMOS gate insulating layer 42, the NMOS gate barrier layer 43, the NMOS outer gate electrode 44, the NMOS inner gate electrode 45, and the first mask pattern M1 on the interlayer insulating layer 35 in the PMOS area PA by performing a planarizing process, and forming a second mask pattern M2 covering the NMOS area NA and exposing the PMOS area PA.

Figure 24:
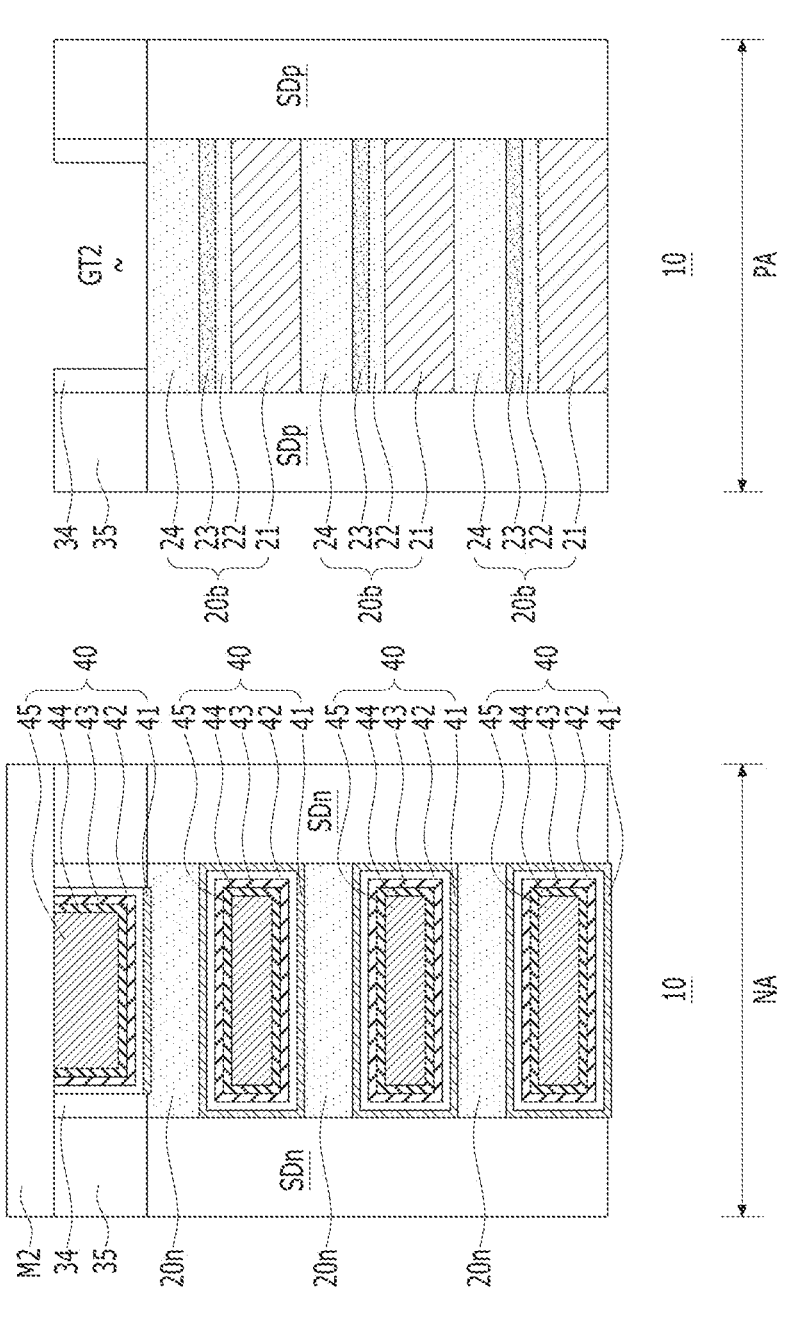

Referring to FIG. 24, the method may further include forming a second gate trench GT2 between the spacers 34 by removing the PMOS dummy gate structure 30*p* in the PMOS area PA. The top surface of the second silicon layer 24 of the preliminary channel pattern 20*n* positioned at the uppermost level in the second gate trench GT2 may be exposed.

Figure 25:
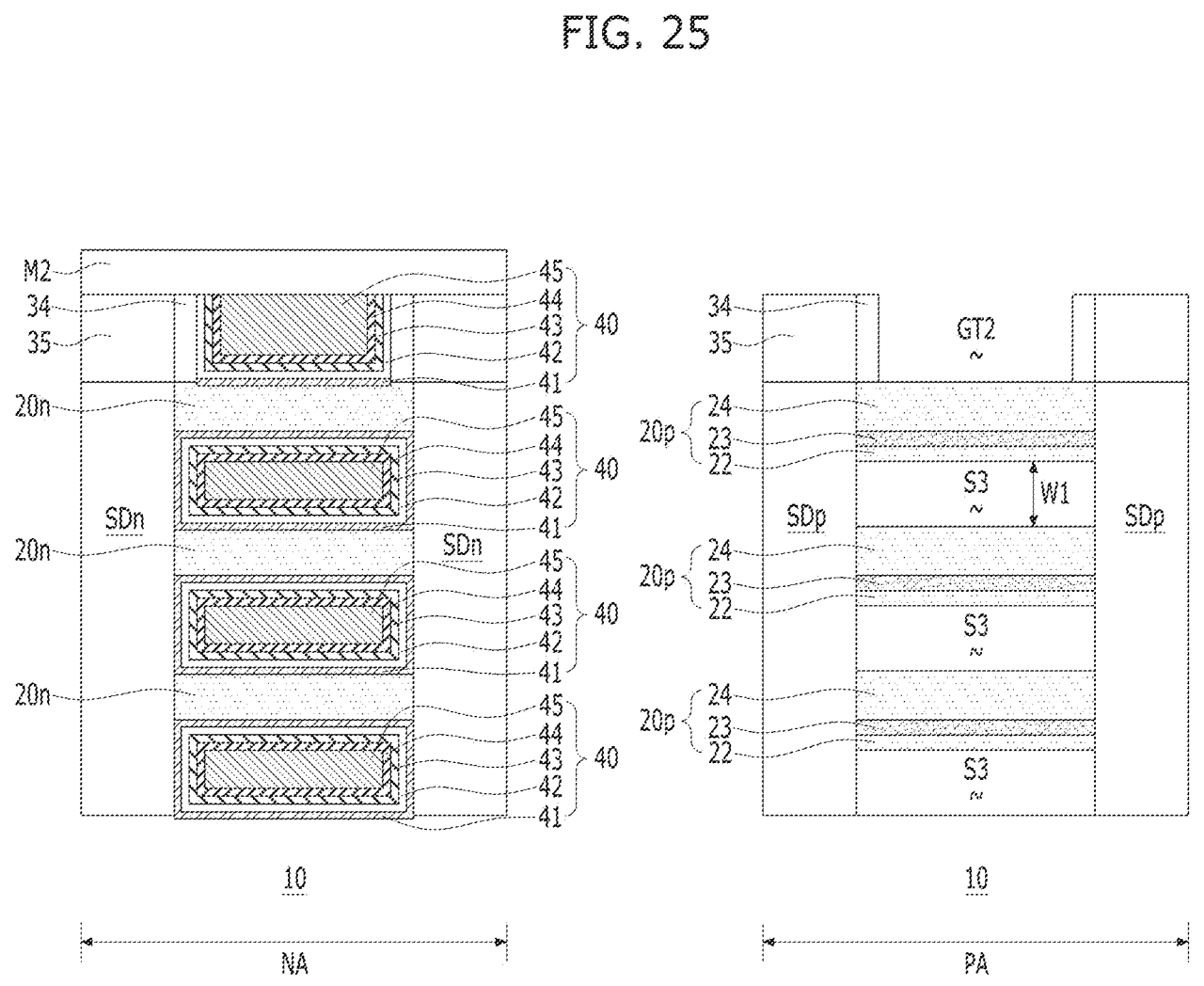

Referring to FIG. 25, the method may further include forming third spaces S3 by removing the sacrificial layers 21 in the PMOS area PA by performing an etching process. The third spaces S3 may have the first vertical width W1 corresponding to the vertical thickness t1 of the sacrificial layers 21 between the top surface of the second silicon layers 24 and the bottom surface of the first silicon layers 22.

Figure 26:
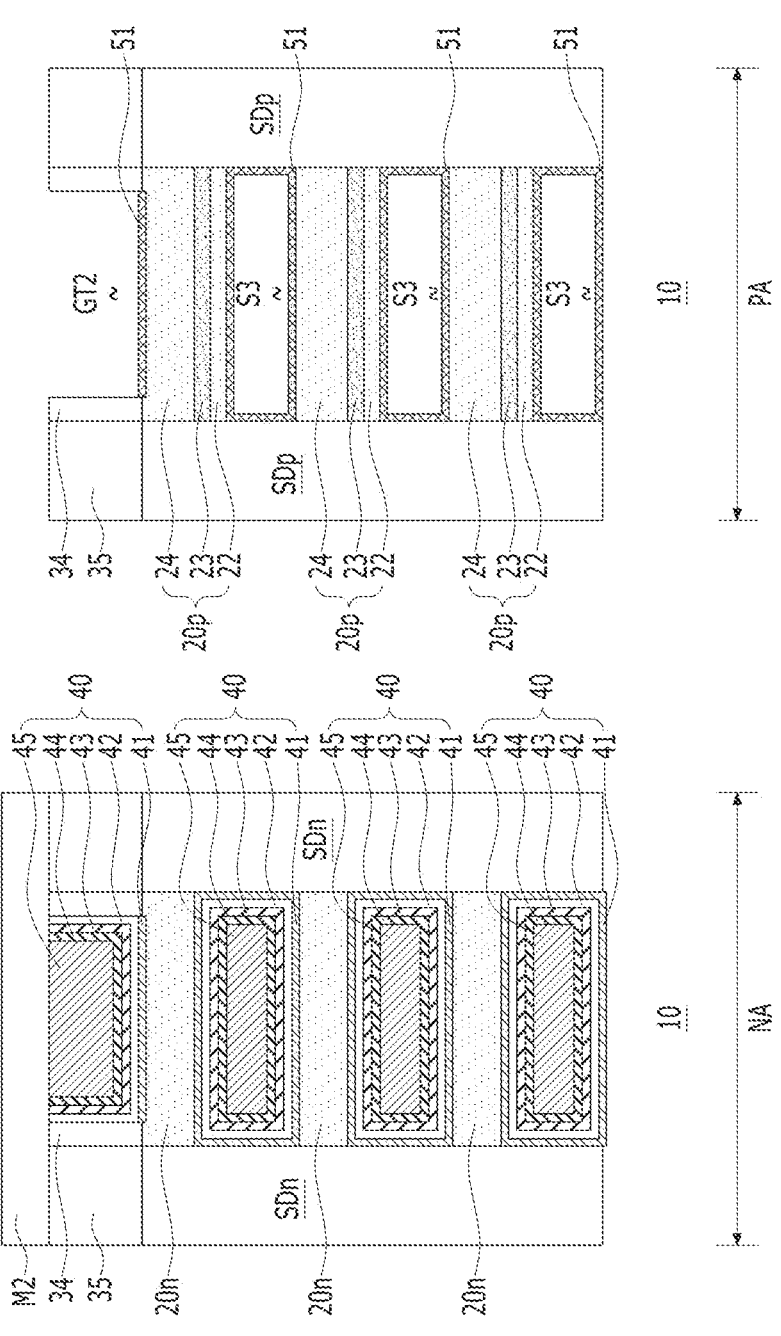

Referring to FIG. 26, the method may further include forming PMOS interfacial insulating layers 51 on the surfaces of the first silicon layers 22, the surfaces of the silicon layers 24, and the surfaces of the NMOS source/drain regions SDn exposed in the second gate trench GT2 and the third spaces S3 in the PMOS area PA by performing one or more oxidation processes.

Figure 27:
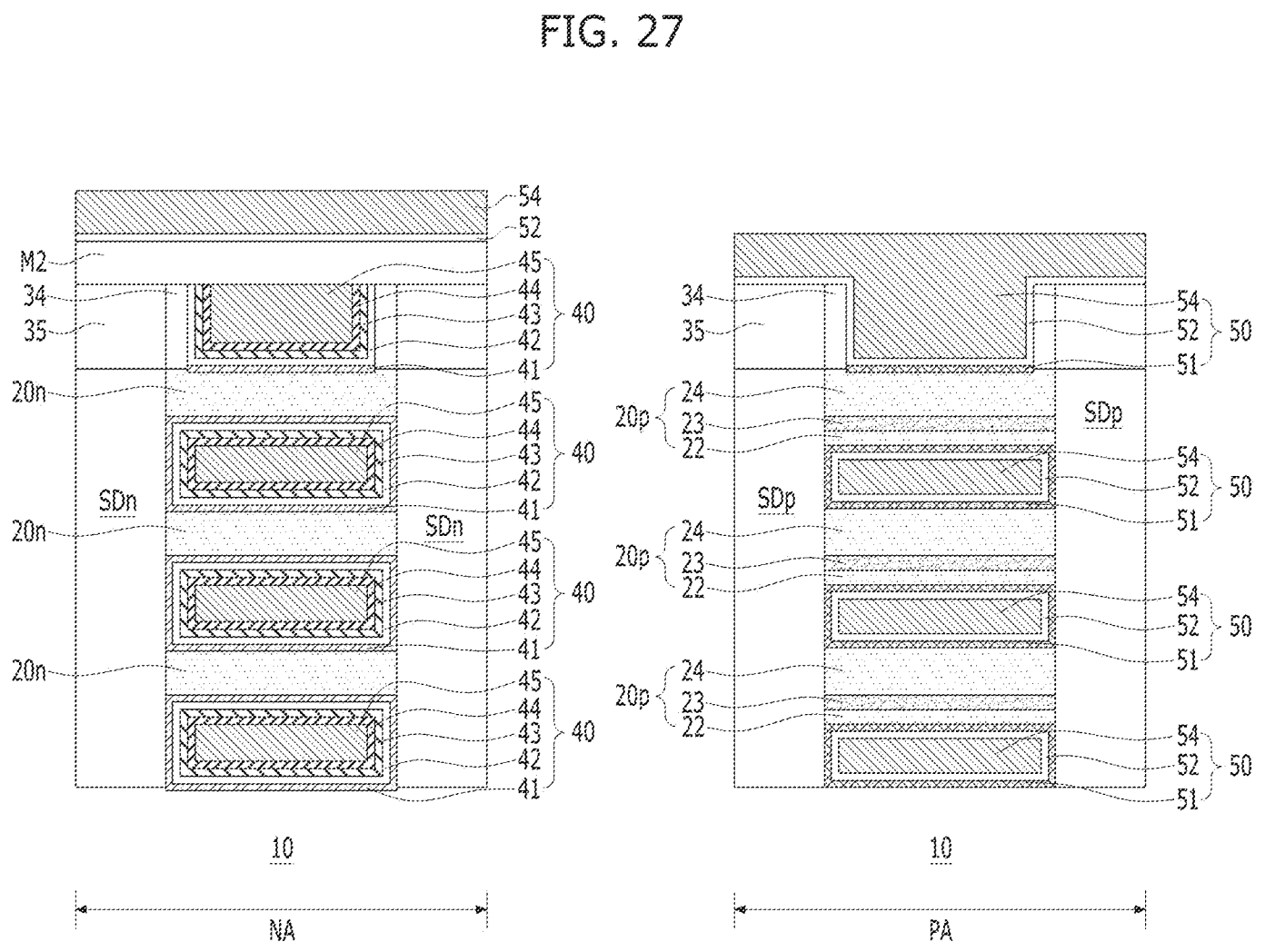

Referring to FIG. 27, the method may further include forming PMOS gate insulating layers 52 and PMOS gate electrodes 54 on the PMOS interfacial insulating layers 51 in the second gate trench GT2 and the third spaces S3 in the PMOS area PA to form PMOS gate structures 50 by performing deposition processes. The PMOS gate insulating layers 52 and the PMOS gate electrodes 54 may also be formed on the second mask pattern M2 in the NMOS area NA.

Thereafter, further referring to FIG. 2, the method may further include removing the PMOS gate insulating layers 52 and the PMOS gate electrodes 54 on the interlayer insulating layer 35 in the PMOS area PA and removing the PMOS gate insulating layer 52, the PMOS gate electrode 54, and the second mask pattern M2 on the interlayer insulating layer 35 in the NMOS area NA by performing an etching process or a planarization process, and forming a gate capping layer 36 in the NMOS area NA and the PMOS area PA by performing one or more deposition processes. The gate capping layer 36 may include a silicon nitride-based material.

Figure 28:
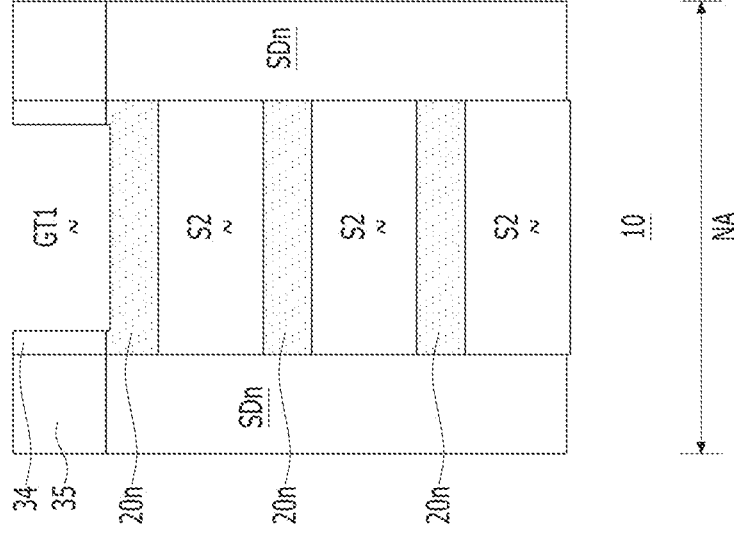

FIGS. 28 to 33 are longitudinal cross-sectional views taken along the lines I-I' and II-II' of FIG. 1 to describe a method of manufacturing a semiconductor device according to an embodiment of the present disclosure. Referring to FIG. 28, a method of manufacturing a semiconductor device according to an embodiment of the present disclosure may include forming a first gate trench GT1 and second spaces S2 in an NMOS area NA, and forming a second gate trench GT2 and third spaces S3 in a PMOS area PA by performing the processes described with reference to FIGS. 3 to 7 and 17 to 20.

Figure 29:
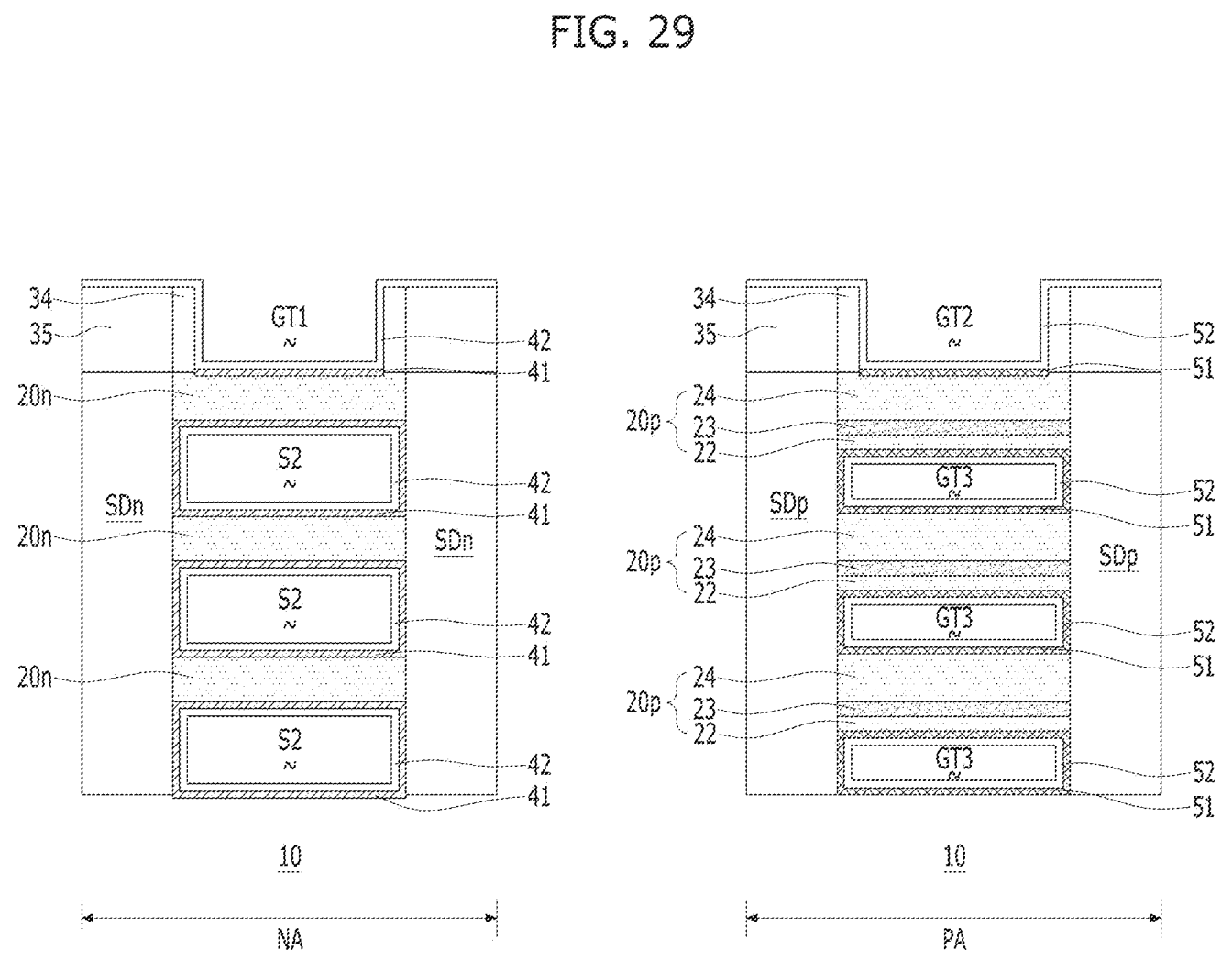

Referring to FIG. 29, the method may further include forming interfacial insulating layers 41 and 51 and gate insulating layers 42 and 52 in the second spaces S2 and the third spaces S3. The interfacial insulating layers 41 and 51 may include NMOS interfacial insulating layers 41 formed in the second spaces S2 in the NMOS area NA and PMOS interfacial insulating layers 51 formed in the third spaces S3 in the PMOS area PA. The gate insulating layers 42 and 52 may include NMOS gate insulating layers 42 formed on the NMOS interfacial insulating layers 41 in the NMOS area NA and PMOS gate insulating layers 52 formed on the PMOS interfacial insulating layers 51 formed in the PMOS area PA. The NMOS interfacial insulating layers 41 and the PMOS interfacial insulating layers 51 may be formed by performing the same process at the same time. The NMOS gate insulating layers 42 and the PMOS gate insulating layers 52 may also be formed by performing the same process at the same time.

Figure 30:
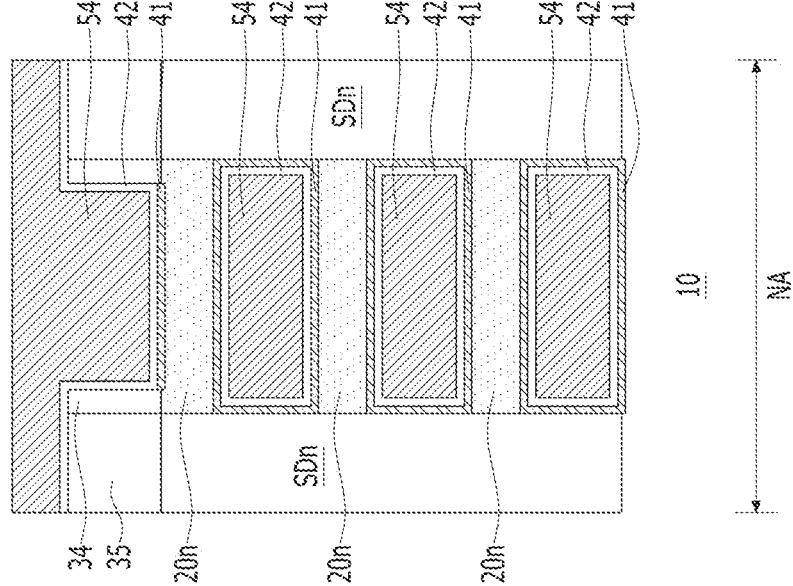

Referring to FIG. 30, the method may further include forming PMOS gate structures 50 by performing the processes described with reference to FIG. 9. Forming the PMOS gate structures 50 may include forming PMOS gate electrodes 54. The PMOS gate electrodes 54 may be formed on the NMOS gate insulating layers 42 in the NMOS area NA.

Figure 31:
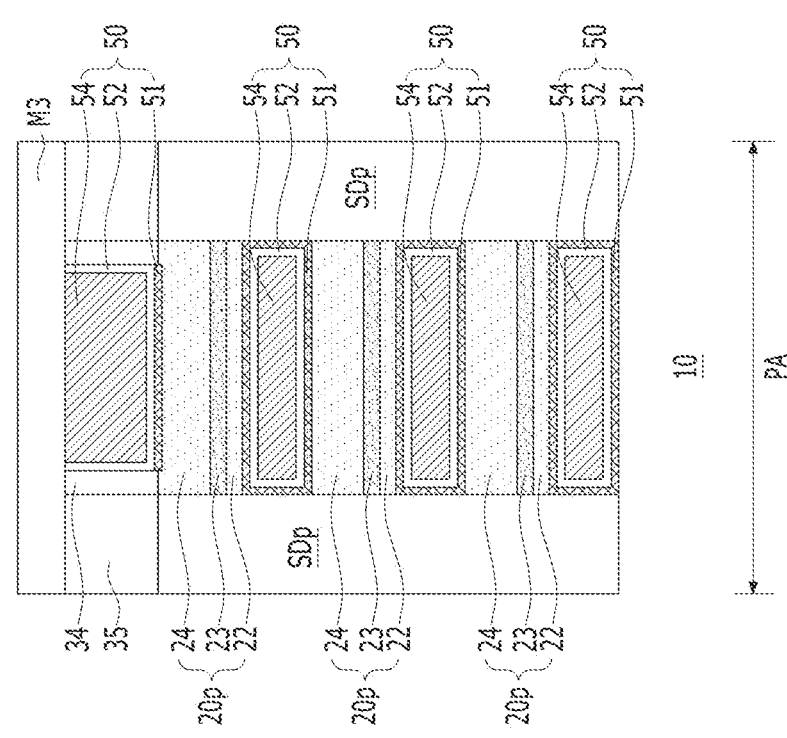
Figure 31:
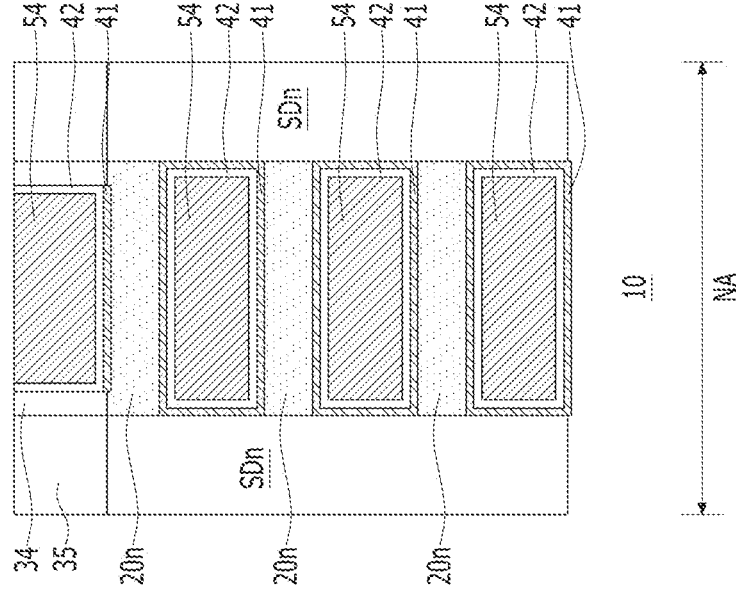

Referring to FIG. 31, the method may further include removing the gate insulating layers 42 and 52 and the PMOS gate electrodes 54 on the interlayer insulating layer 35 by performing a planarization process, and forming a third mask pattern M3 covering the PMOS area PA and exposing the NMOS area NA. The third mask pattern M3 may include the same material as the first mask pattern M1 and the second mask pattern M2. The PMOS gate electrodes 54 may be exposed in the NMOS area NA.

Figure 32:
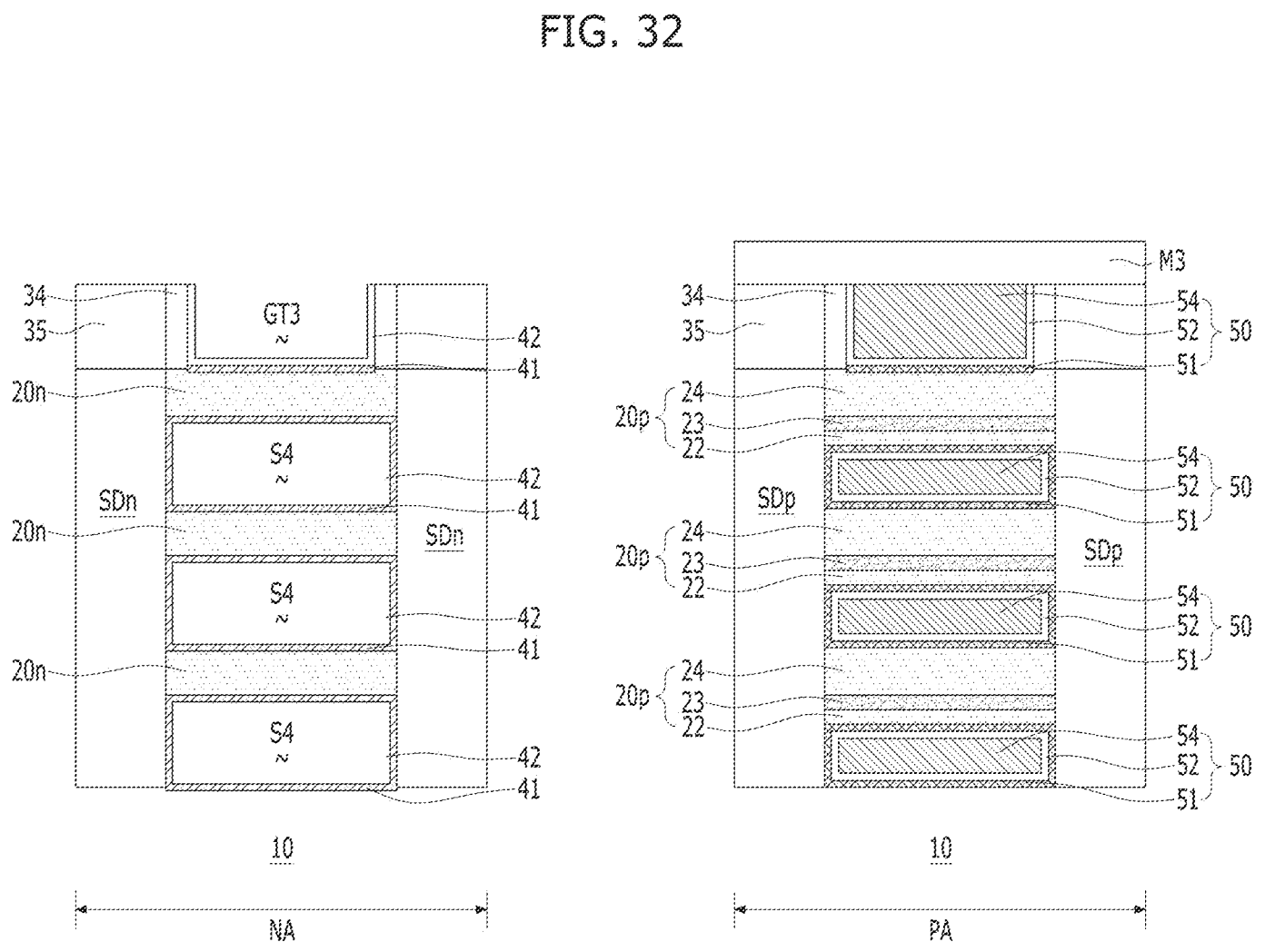

Referring to FIG. 32, the method may further include removing the PMOS gate electrodes 54 in the NMOS area NA to form third gate trench GT3 and fourth spaces S4. The second spaces S2 may be expanded to form the fourth spaces S4 by removing the PMOS gate electrodes 54 in the NMOS area NA.

Figure 33:
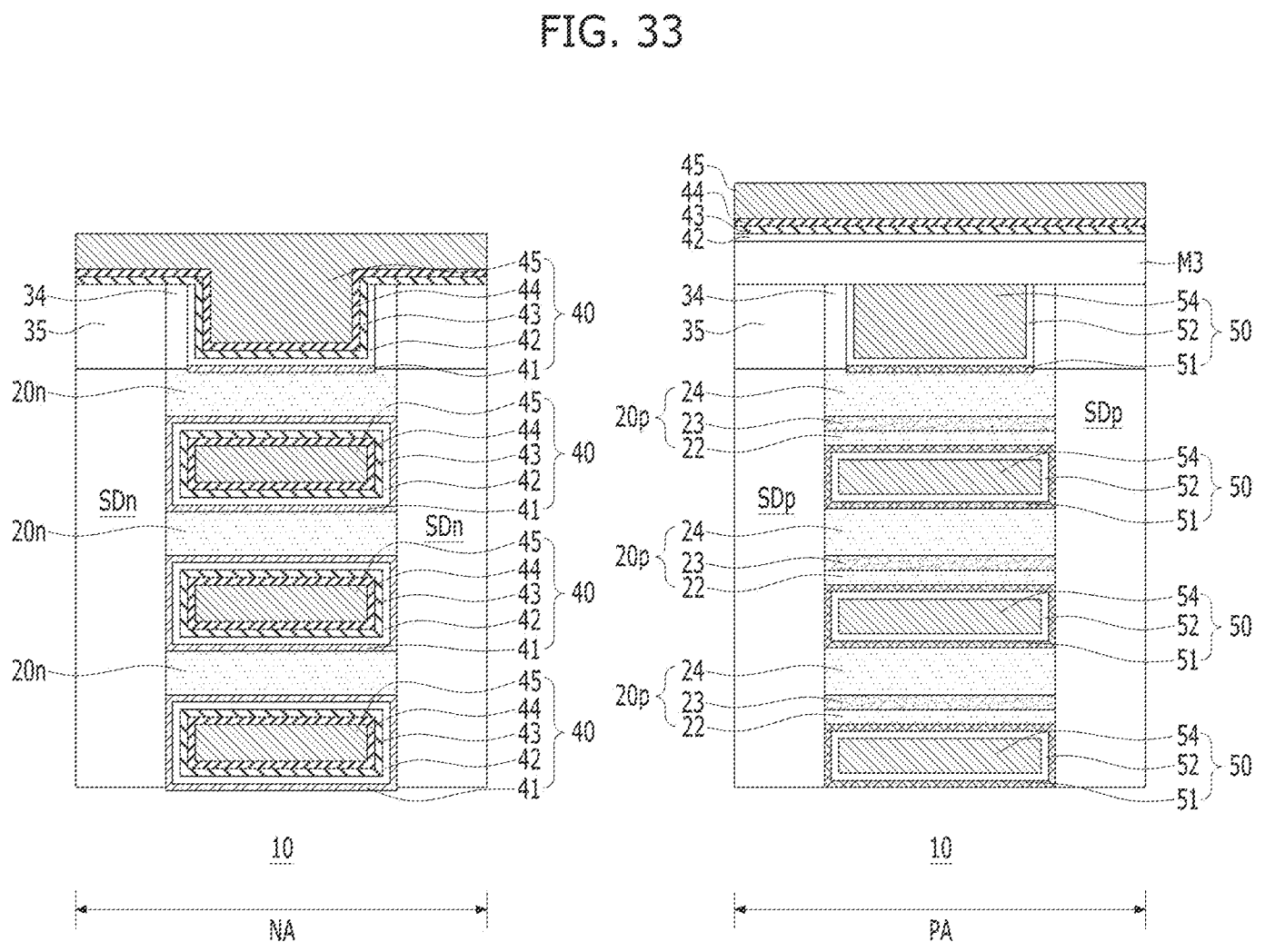

Referring to FIG. 33, the method may further include forming NMOS gate structures 40 in the third gate trench GT3 and the fourth spaces S4 in the NMOS area NA. Forming the NMOS gate structures 40 may include forming NMOS gate barrier layers 43, NMOS outer gate electrodes 44, and NMOS inner gate electrodes 45 by performing deposition processes.

Thereafter, further referring to FIG. 2, the method may further include removing the third mask pattern M3, the NMOS gate barrier layer 43, the NMOS outer gate electrode 44, and the NMOS inner gate electrode 45 on the interlayer insulating layer 35 by performing a planarization process, and forming the gate capping layer 36.

FIGS. 34 to 37 are longitudinal cross-sectional views taken along the lines I-I' and II-II' of FIG. 1 to describe a method of manufacturing a semiconductor device according to an embodiment of the present disclosure. Referring to FIG. 34, a method of manufacturing a semiconductor device according to an embodiment of the present disclosure may include forming a first gate trench GT1 and second spaces S2 in an NMOS area NA, a second gate trench GT2 and third spaces S3 in a PMOS area PA by performing the processes described with reference to FIGS. 3 to 7, 17 to 20, and 28 to 29, and forming NMOS gate barrier layers 43, NMOS outer gate electrodes 44, and NMOS inner gate electrodes 45 on the NMOS gate insulating layers 42 in the first gate trench GT1 and the second spaces S2 in the NMOS area NA by further performing the processes described in FIG. 16 or FIG. 22.

Figure 35:
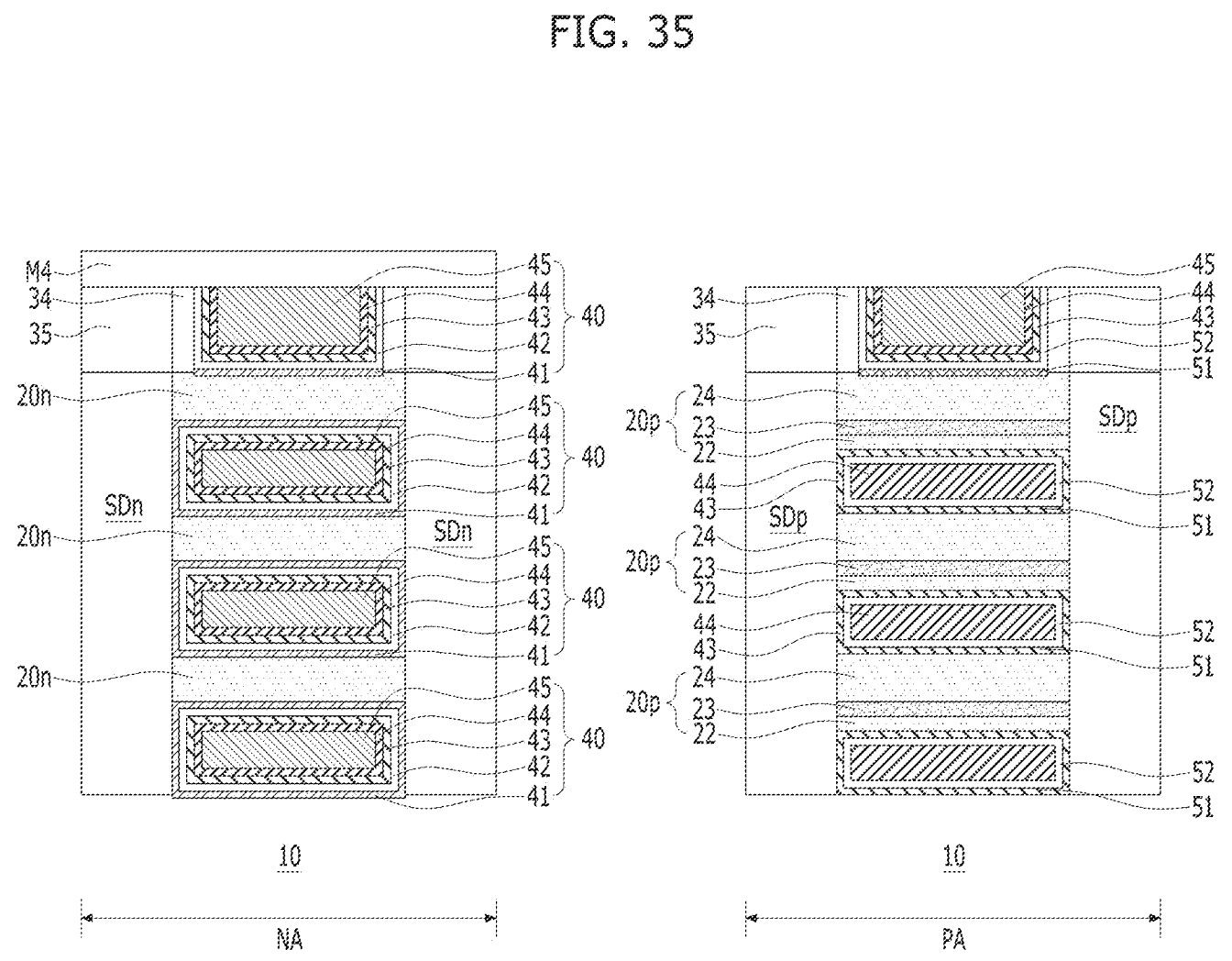

Referring to FIG. 35, the method may further include removing the NMOS gate insulating layer 42, the NMOS gate barrier layer 43, the NMOS outer gate electrode 44, and the NMOS inner gate electrode 45 on the interlayer insulating layer 35 in the NMOS area NA, and removing the PMOS gate insulating layer 52, the NMOS gate insulating layer 42, the NMOS gate barrier layer 43, the NMOS outer gate electrode 44, the NMOS inner gate electrode 45, and the third mask pattern M3 on the interlayer insulating layer 35 in the PMOS area PA, and forming a fourth mask pattern M4 covering the NMOS area NA and exposing the PMOS area PA.

Figure 36:
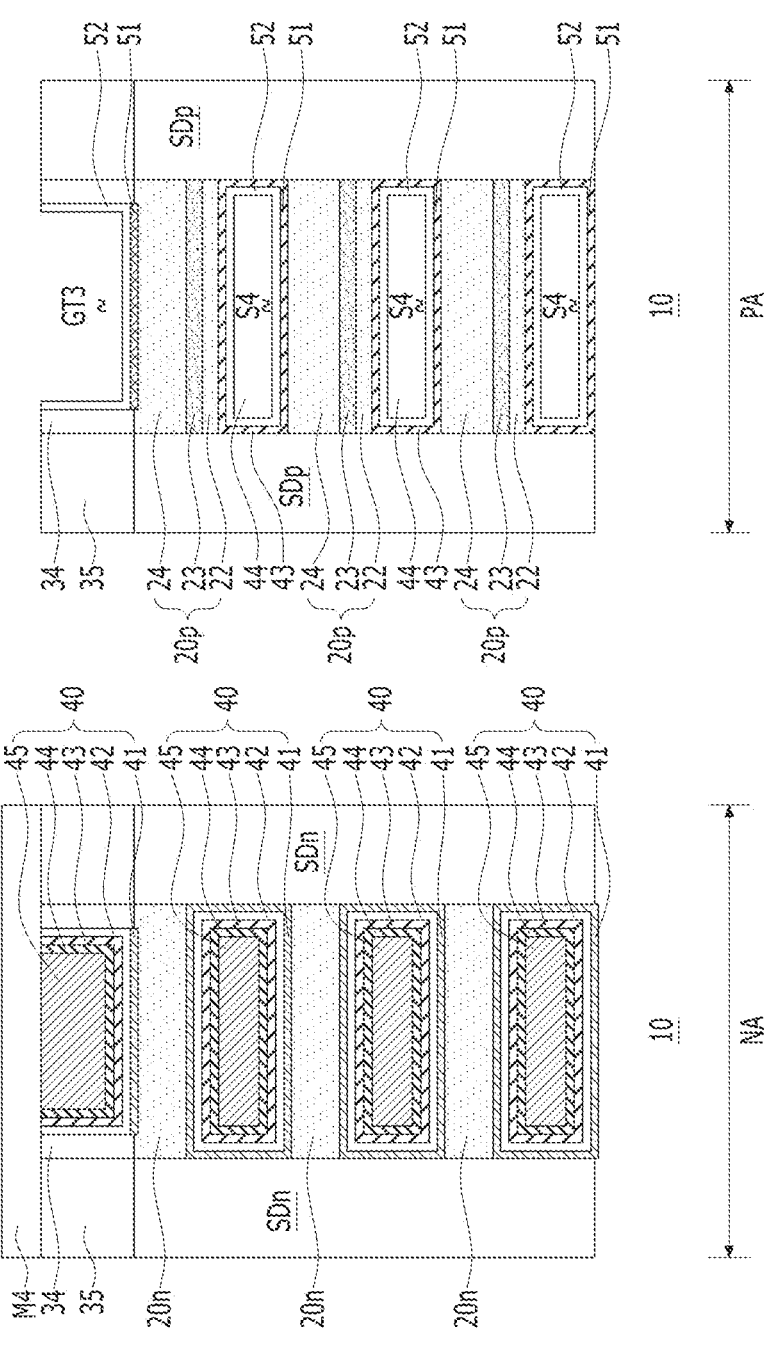

Referring to FIG. 36, the method may further include removing the NMOS gate barrier layers 43, the NMOS outer gate electrodes 44, and the NMOS inner gate electrodes 45 in the PMOS area PA to form fourth spaces S4.

Figure 37:
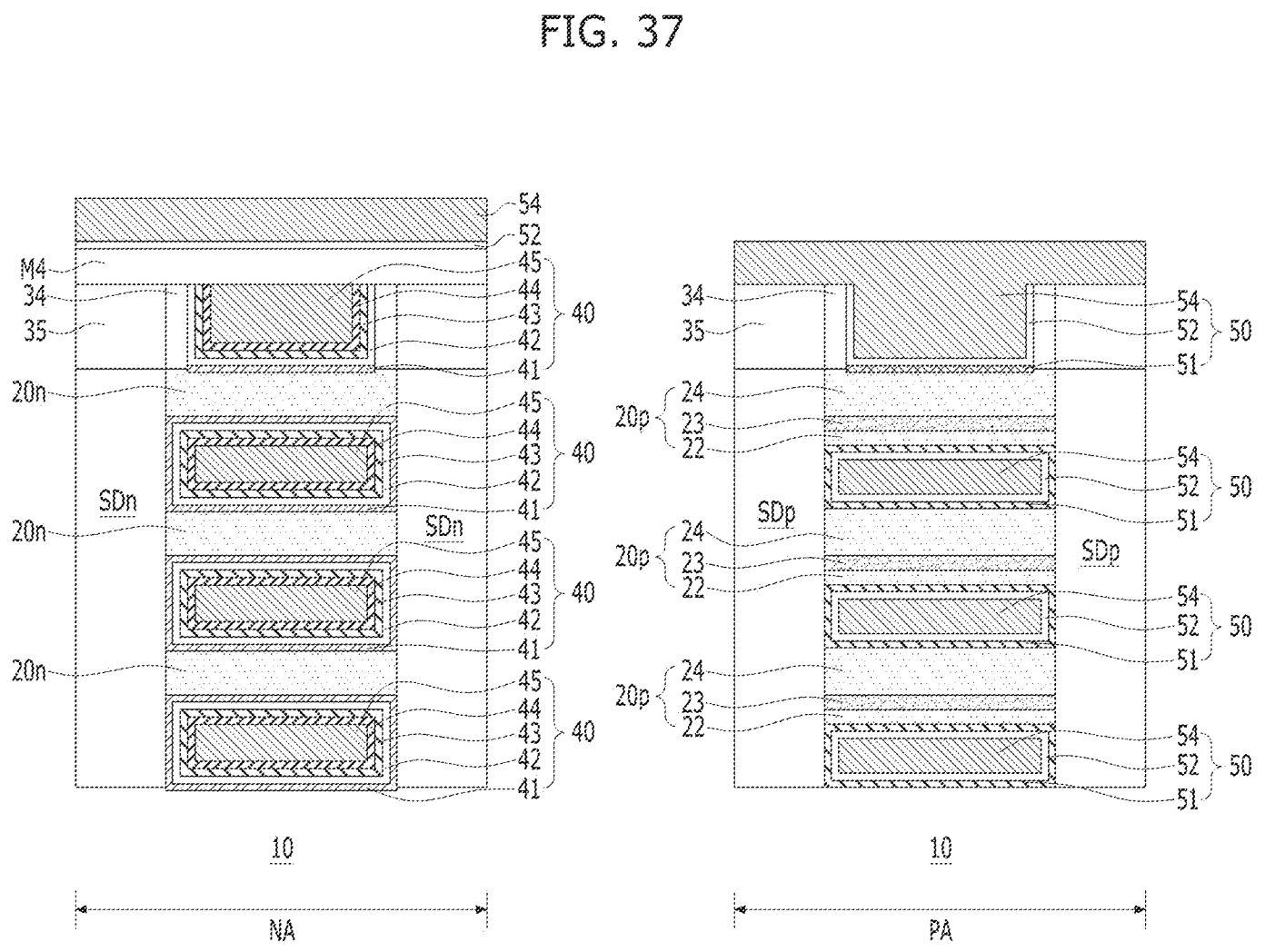

Referring to FIG. 37, the method may further include forming PMOS gate electrodes 54 in the fourth spaces S4 in the PMOS area PA. A PMOS gate insulating layer 52 may be formed on the fourth mask pattern M4, and the PMOS gate electrodes 54 may also be formed on the fourth mask pattern M4 in the NMOS area NA.

Thereafter, further referring to FIG. 2, the method may further include removing the fourth mask pattern M4, the NMOS gate barrier layer 43, the NMOS outer gate electrode 44, and the NMOS inner gate electrode 45 on the interlayer insulating layer 35 by performing a planarization process, and forming the gate capping layer 36.

According to the embodiments of the present disclosure, the semiconductor device can have an NMOS transistor and a PMOS transistor with improved performance.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
an NMOS transistor structure formed over an NMOS area of a substrate; and
a PMOS transistor structure formed over a PMOS area of the substrate,
wherein the NMOS transistor structure includes:
NMOS source/drain regions formed over the substrate; and
NMOS channel patterns and NMOS gate structures alternately and repeatedly stacked over the substrate between the NMOS source/drain regions in a horizontal direction,
wherein the PMOS transistor structure includes:
PMOS source/drain regions formed over the substrate; and
PMOS channel patterns and PMOS gate structures alternately and repeatedly stacked over the substrate between the PMOS source/drain regions in the horizontal direction,
wherein:
each of the NMOS channel patterns includes a single silicon layer, and
each of the PMOS channel patterns includes a first silicon layer, a second silicon layer, and a silicon germanium layer between the first silicon layer and the second silicon layer,
each of the PMOS gate structures includes a PMOS interfacial insulating layer, a PMOS gate insulating layer, and a PMOS gate electrode,
the PMOS interfacial insulating layer is conformally formed over bottom surface of the first silicon layer and top surface of the second silicon layer, and
wherein the silicon germanium layer is not in contact with a silicon oxide layer.

2. The semiconductor device of claim 1, wherein:
the single silicon layer of each of the NMOS channel patterns and the second silicon layer of each of the PMOS channel patterns are positioned at a same level, and
a vertical thickness of the single silicon layer of each of the NMOS channel patterns is smaller than a vertical thickness of the second silicon layer of each of the PMOS channel patterns.

3. The semiconductor device of claim 1, wherein:
each of the NMOS gate structures includes an NMOS interfacial insulating layer, an NMOS gate insulating layer, an NMOS gate barrier layer, an NMOS outer gate electrode, and an NMOS inner gate electrode.

4. The semiconductor device of claim 3, wherein:
the NMOS interfacial insulating layers and the PMOS interfacial insulating layers include a same material, the NMOS gate insulating layers and the PMOS gate insulating layers include a same material,
the NMOS gate barrier layers and the PMOS gate electrodes include a same material, and
the NMOS outer gate electrodes include an NMOS work function control metal.

5. The semiconductor device of claim 3, wherein:
each of the NMOS interfacial insulating layers is conformally formed over top and bottom surfaces of each of the NMOS channel patterns, inner surfaces of the NMOS source/drain regions, and a first surface of the substrate in the NMOS area,
each of the PMOS interfacial insulating layers is conformally formed over inner surfaces of the PMOS source/drain regions, and a second surface of the substrate in the PMOS area, and
the first surface of the substrate is more recessed than the second surface of the substrate.

6. The semiconductor device of claim 1,
wherein a vertical thickness of each of the NMOS channel patterns is smaller than a vertical thickness of each of the PMOS channel patterns.

7. The semiconductor device of claim 1,
wherein a vertical thickness of each of the NMOS gate structures is greater than a vertical thickness of each of the PMOS gate structures.

8. The semiconductor device of claim 1,
wherein the PMOS interfacial insulating layer includes an oxidized silicon layer formed by oxidizing the bottom surface of the first silicon layer and the top surface of the second silicon layer.

9. The semiconductor device of claim 1,
wherein the silicon germanium layer of each of the PMOS channel patterns are not in contact with the PMOS interfacial insulating layer.

10. A semiconductor device comprising:
an NMOS transistor structure formed over an NMOS area of a substrate; and
a PMOS transistor structure formed over a PMOS area of the substrate,
wherein the NMOS transistor structure includes:
NMOS source/drain regions formed over the substrate; and
NMOS channel patterns and NMOS gate structures alternately and repeatedly stacked between the NMOS source/drain regions in a horizontal direction,
wherein the PMOS transistor structure includes:
PMOS source/drain regions formed over the substrate; and
PMOS channel patterns and PMOS gate structures alternately and repeatedly stacked between the PMOS source/drain regions in the horizontal direction,
wherein:
each of the NMOS gate structures includes an NMOS interfacial insulating layer, an NMOS gate insulating layer, an NMOS gate barrier layer, an NMOS outer gate electrode, and an NMOS inner gate electrode, and
each of the PMOS gate structures includes a PMOS interfacial insulating layer, a PMOS gate insulating layer, and a PMOS gate electrode,
wherein:
a vertical thickness of each of the NMOS channel patterns is smaller than a vertical thickness of each of the PMOS channel patterns, and
a vertical thickness of each of the NMOS gate structures is greater than a vertical thickness of each of the PMOS gate structures, wherein each of the PMOS channel patterns includes a first silicon layer, a second silicon layer, and a silicon germanium layer between the first silicon layer and the second silicon layer, and wherein the silicon germanium layer is not in contact with a silicon oxide layer.

11. The semiconductor device of claim 10, wherein:

each of the NMOS channel patterns includes a single silicon layer.

12. The semiconductor device of claim 10, wherein:

the NMOS interfacial insulating layers and the PMOS interfacial insulating layers include an oxidized silicon layer, the NMOS gate insulating layers and the PMOS gate insulating layers include insulating layers containing hafnium or zirconium, the NMOS gate barrier layers and the PMOS gate electrodes include titanium nitride, and the NMOS inner gate electrodes include a metal alloy or metal compound containing aluminum.

13. The semiconductor device of claim 10, wherein:

each of the NMOS interfacial insulating layers is conformally formed over top and bottom surfaces of the NMOS channel patterns, inner surfaces of the NMOS source/drain regions, and a first surface of the substrate;

each of the PMOS interfacial insulating layers is conformally formed over top and bottom surfaces of the PMOS channel patterns, inner surfaces of the PMOS source/drain regions, and a second surface of the substrate, and the first surface of the substrate is more recessed than the second surface of the substrate.

14. The semiconductor device of claim 10, wherein each of the NMOS gate structures further includes the NMOS outer gate electrode between the NMOS gate barrier layer and the NMOS inner gate electrode rather than each of the PMOS gate structures.

* * * * *